(12) United States Patent
Park et al.

(10) Patent No.: US 11,871,602 B2
(45) Date of Patent: Jan. 9, 2024

(54) FLEXIBLE DISPLAY PANEL HAVING BUFFER PORTION IMPROVING RIGIDITY IN FOLDING PORTION

(71) Applicant: LG Display Co., Ltd., Seoul (KR)

(72) Inventors: Seong Woo Park, Paju-si (KR); Seung Han Paek, Paju-si (KR); Yu Cheol Yang, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 266 days.

(21) Appl. No.: 17/365,953

(22) Filed: Jul. 1, 2021

(65) Prior Publication Data
US 2022/0006038 A1    Jan. 6, 2022

(30) Foreign Application Priority Data
Jul. 2, 2020  (KR) .......................... 10-2020-0081696

(51) Int. Cl.
*H10K 50/84*    (2023.01)
*H10K 59/38*    (2023.01)
*H10K 77/10*    (2023.01)
*H10K 102/00*   (2023.01)

(52) U.S. Cl.
CPC ........... *H10K 50/841* (2023.02); *H10K 59/38* (2023.02); *H10K 77/111* (2023.02); *H10K 2102/311* (2023.02); *H10K 2102/331* (2023.02)

(58) Field of Classification Search
CPC .... H10K 50/841; H10K 59/38; H10K 77/111; H10K 2102/311; H10K 2102/331; H10K 59/87; H10K 71/851; H10K 50/844; H10K 50/86; H10K 59/12; H10K 50/8426; Y02E 10/549; G09F 9/301; H01L 27/1218
See application file for complete search history.

(56) References Cited

U.S. PATENT DOCUMENTS

| | | | |
|---|---|---|---|
| 10,020,462 B1* | 7/2018 | Ai | H10K 50/841 |
| 2017/0237027 A1* | 8/2017 | Lee | H01L 27/1251 257/40 |
| 2017/0250355 A1* | 8/2017 | Shirahata | H10K 50/84 |
| 2018/0076236 A1* | 3/2018 | Kwon | H10K 59/87 |
| 2018/0188432 A1* | 7/2018 | Choi | H10K 50/86 |

(Continued)

FOREIGN PATENT DOCUMENTS

| | | |
|---|---|---|
| KR | 10-2019-0124844 A | 11/2019 |
| KR | 10-2069040 B | 1/2020 |

(Continued)

*Primary Examiner* — J. E. Schoenholtz
(74) *Attorney, Agent, or Firm* — POLSINELLI PC

(57) ABSTRACT

A flexible display panel includes a glass substrate, a circuit layer disposed on the glass substrate and configured to drive a pixel, a light-emitting element layer disposed on the circuit layer, an encapsulation layer which covers the circuit layer and the light-emitting element layer, a polarizing plate disposed on the encapsulation layer, and a cover glass disposed on the polarizing plate, at least one of the glass substrate and the cover glass includes a buffer portion, the buffer portion includes an organic filler and glass, the glass of the buffer portion has a thickness less than or equal to a thickness of the glass substrate and includes a pattern of a specific shape, thus, rigidity of a folding portion in which the buffer portion is located can be increased due to the glass in the buffer portion.

27 Claims, 27 Drawing Sheets

(56) References Cited

U.S. PATENT DOCUMENTS

| | | | |
|---|---|---|---|
| 2018/0217639 A1* | 8/2018 | Jones | G06F 1/1626 |
| 2020/0295297 A1* | 9/2020 | Jo | H10K 71/00 |
| 2021/0191467 A1* | 6/2021 | Sunwoo | C03C 15/00 |
| 2021/0296412 A1* | 9/2021 | Liu | H10K 59/12 |
| 2022/0223806 A1* | 7/2022 | Ostholt | H10K 77/111 |

FOREIGN PATENT DOCUMENTS

| | | |
|---|---|---|
| KR | 10-2078679 B | 2/2020 |
| KR | 10-2020-0030291 A | 3/2020 |

\* cited by examiner

FIG. 1
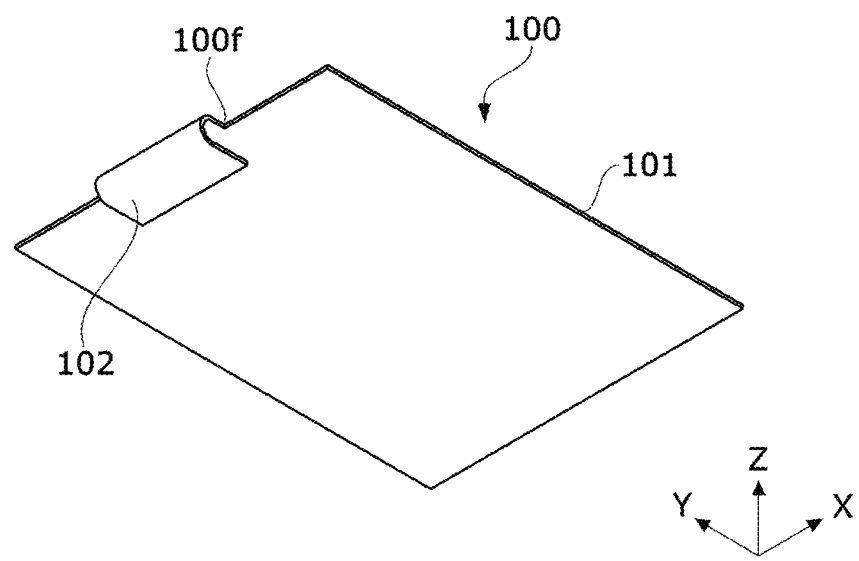
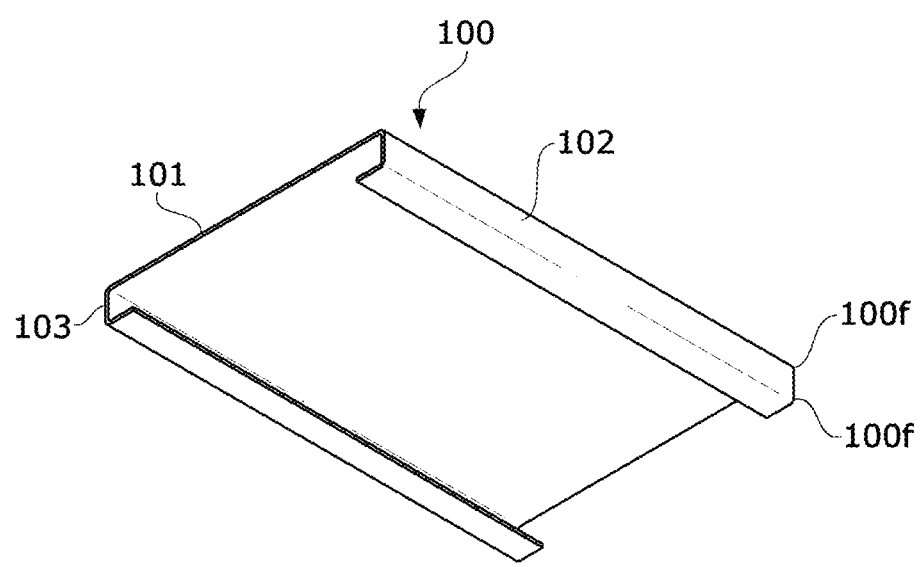

FIG. 7
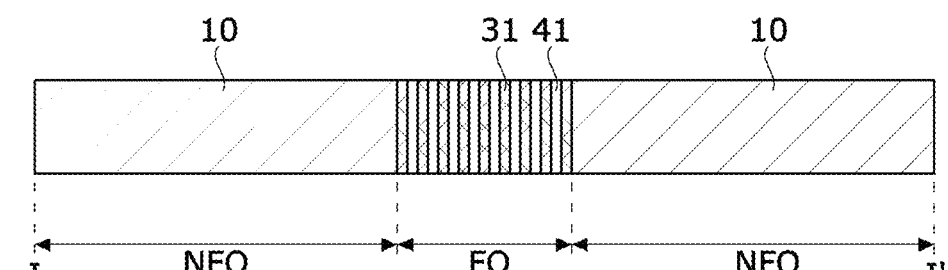
(a)
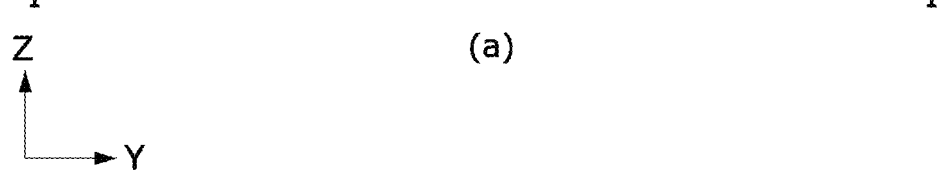
(b)

FIG. 10
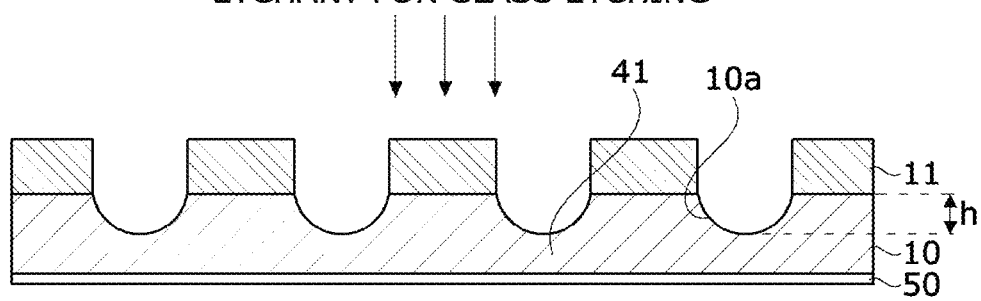
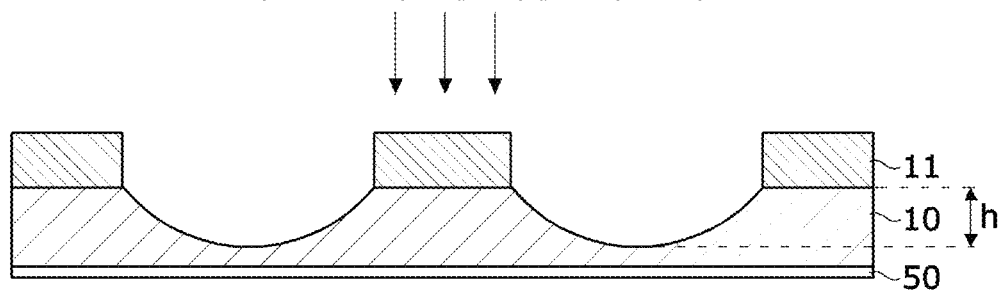
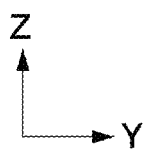

FIG. 20
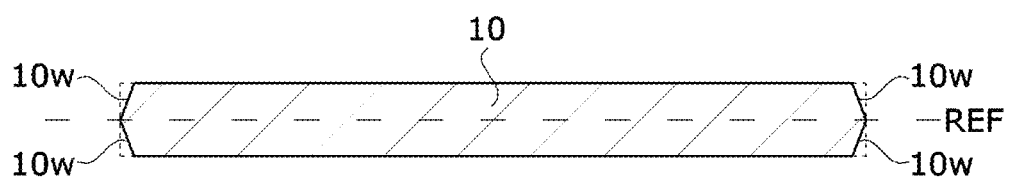
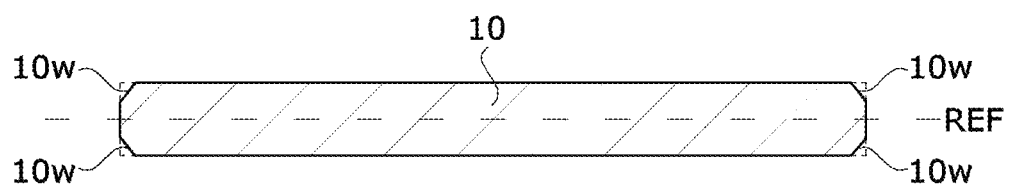
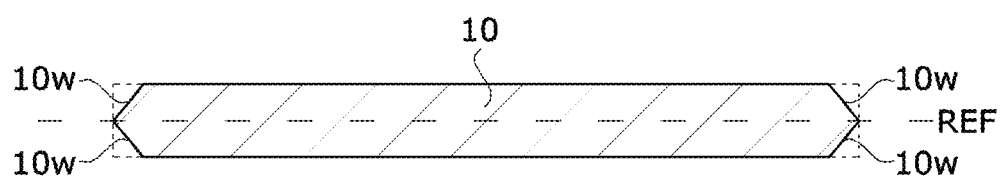
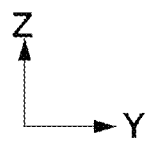

FLEXIBLE DISPLAY PANEL HAVING BUFFER PORTION IMPROVING RIGIDITY IN FOLDING PORTION

CROSS-REFERENCE TO RELATED APPLICATION

This application claims priority to and the benefit of Korean Patent Application No. 10-2020-0081696, filed on Jul. 2, 2020, which is hereby incorporated by reference in its entirety.

BACKGROUND

Field of the Disclosure

The present disclosure relates to a flexible display panel.

Description of the Background

Electroluminescent display devices are roughly classified into inorganic light emitting display devices and organic light emitting display devices according to materials of light emitting layers. Active matrix type organic light emitting display devices include organic light-emitting diodes (hereinafter referred to as "OLEDs"), which emit light by themselves, and have fast response speeds and advantages in which light emission efficiencies, brightness, and viewing angles are high. In the organic light-emitting display devices, the OLEDs are formed in pixels. Since the organic light-emitting display devices have fast response speeds and are excellent in light emission efficiency, brightness, and viewing angle as well as being able to exhibit a black gradation in a full black color, the organic light-emitting display devices are excellent in a contrast ratio and color reproducibility.

The organic light-emitting display devices do not require backlight units and may be implemented on a plastic substrate made of a flexible material, a thin glass substrate, or a metal substrate. Therefore, flexible displays may be implemented as the organic light-emitting display devices.

A screen size of the flexible display may be varied by winding, folding, and bending a flexible display panel. The flexible display may be implemented as a rollable display, a foldable display, a bendable display, a slidable display, or the like. The flexible display may be applied not only to mobile devices such as smartphones and tablet personal computers (PCs) but also to televisions (TVs), vehicle displays, and wearable devices, and application fields of the flexible display device are expanding.

The flexible display may implement a bezel bended display in which a bezel area is minimized by folding a non-display area using a flexible panel structure. In addition, the flexible display may be coupled to an information device in a structure capable of varying a size of a screen. Since the information device employs the flexible display to increase the size of the screen, multi-tasking is possible by executing two or more applications or contents.

SUMMARY

A flexible substrate employed in the flexible display may be made of a flexible material, for example, a polyimide (PI) film substrate. In a manufacturing process of the flexible display panel, a circuit layer and a light-emitting element may be formed on a PI film in a state in which a carrier substrate having high rigidity and heat resistance is bonded below the PI film substrate. Since the carrier substrate is required in only the manufacturing process, the carrier substrate may be separated from the PI film substrate after all layers required for driving pixels are formed on the PI film. The carrier substrate may be separated from the PI film substrate through a laser lift-off process using laser equipment.

In the manufacturing process of the flexible display panel, a manufacturing cost is high due to using expensive laser equipment, and defects may be caused in subsequent processes due to surface roughness of the PI film and foreign materials which are generated when a laser is radiated onto the entire surface of the PI film substrate to delaminate the PI film substrate.

In addition, a folding portion may be made of only an organic material so as to allow the flexible display panel to bend flexibly. In this case, since rigidity of the folding portion is weak, folded creases or hinge stains may appear.

The present disclosure is directed to solving all the above-described necessity and problems.

The present disclosure is directed to a flexible display panel which does not require for using expensive laser equipment, allows prevention of defects caused by a process of delaminating a PI film from a carrier substrate, and allows rigidity of a folding portion to be increased.

It should be noted that the present disclosure is not limited to the above-described features, and other features of the present disclosure will be apparent to those skilled in the art from the following descriptions.

According to an aspect of the present disclosure, there is provided a flexible display panel including a glass substrate, a circuit layer disposed on the glass substrate and configured to drive a pixel, a light-emitting element layer disposed on the circuit layer, an encapsulation layer which covers the circuit layer and the light-emitting element layer, a polarizing plate disposed on the encapsulation layer, and a cover glass disposed on the polarizing plate. At least one of the glass substrate and the cover glass may include a buffer portion. The buffer portion may include an organic filler and glass. The glass of the buffer portion may have a thickness less than or equal to a thickness of the glass substrate and may include a pattern of a specific shape.

According to another aspect of the present disclosure, there is provided a flexible display panel including a glass substrate, a circuit layer disposed on the glass substrate and configured to drive a pixel, a light-emitting element layer disposed on the circuit layer, an encapsulation layer which covers the circuit layer and the light-emitting element layer, a polarizing plate disposed on the encapsulation layer, and a cover glass disposed on the polarizing plate. At least one of the glass substrate and the cover glass may include a buffer portion. The buffer portion may include an organic filler and glass. A ratio of a thickness of the organic filler to a thickness of the glass in the buffer portion may be in a range of 6 to 10:4 to 9.

BRIEF DESCRIPTION OF THE DRAWINGS

The above and other features and advantages of the present disclosure will become more apparent to those skilled in the art by describing exemplary aspects thereof in detail with reference to the accompanying drawings, in which:

FIGS. 1 to 3 are diagrams illustrating flexible display panels including folding portions;

FIG. 7 shows cross-sectional views illustrating a glass substrate taken along line "I-I" of FIG. 6;

FIGS. 9 and 10 are diagrams illustrating an etching method of a glass substrate;

FIG. 20 is a diagram illustrating various examples of a wedge-type sidewall of the glass substrate;

DETAILED DESCRIPTION

Figure 2:
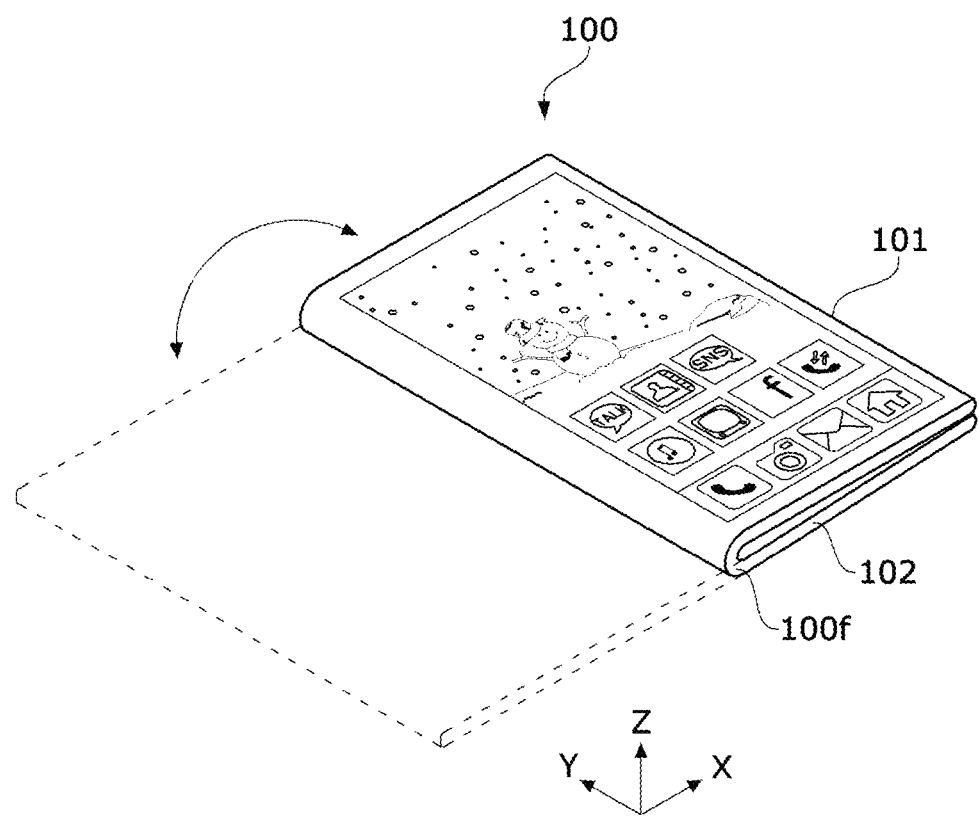

The advantages and features of the present disclosure and methods for accomplishing the same will be more clearly understood from aspects described below with reference to the accompanying drawings. However, the present disclosure is not limited to the following aspects but may be implemented in various different forms. Rather, the present aspects will make the disclosure of the present disclosure complete and allow those skilled in the art to completely comprehend the scope of the present disclosure. The present disclosure is only defined within the scope of the accompanying claims.

The shapes, sizes, ratios, angles, numbers, and the like illustrated in the accompanying drawings for describing the aspects of the present disclosure are merely examples, and the present disclosure is not limited thereto. Like reference numerals generally denote like elements throughout the present specification. Further, in describing the present disclosure, detailed descriptions of known related technologies may be omitted to avoid unnecessarily obscuring the subject matter of the present disclosure.

The terms such as "comprising," "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two components is described using the terms such as "on," "above," "below," and "next," one or more components may be positioned between the two components unless the terms are used with the term "immediately" or "directly."

The terms "first," "second," and the like may be used to distinguish components from each other, but the functions or structures of the components are not limited by ordinal numbers or component names in front of the components.

The same reference numerals may refer to substantially the same elements throughout the present disclosure.

The following aspects can be partially or entirely bonded to or combined with each other and can be linked and operated in technically various ways. The aspects can be carried out independently of or in association with each other.

Hereinafter, the display panel may be interpreted as having the same meaning as a flexible display panel. "Folding portion" refers to a part that is bent in a flexible display panel.

Hereinafter, various aspects of the present disclosure will be described in detail with reference to the accompanying drawings.

A display panel of the present disclosure is manufactured based on a bendable thin glass substrate. The glass substrate may be a glass film having a thickness of 0.2 mm or less. A commercially available reinforced glass film may be employed as the glass film. Hereinafter, a glass substrate may be construed as the glass film.

As shown in FIG. 1, a display panel 100 has a width in an X-axis direction, a length in a Y-axis direction, and a constant thickness in a Z-axis direction. Since a circuit layer and a light-emitting element layer may be disposed on a glass substrate, a thickness of the display panel 100 may be greater than a thickness of the glass substrate. The width and the length of the display panel 100 may be set to various design values according to an application field of a display device. As shown in FIG. 1, the display panel 100 may be manufactured in a substantially rectangular-shaped plate, but the present disclosure is not limited thereto. For example, the display panel 100 may be manufactured as a different panel including a curved portion.

The display panel 100 includes non-folding portions 101 and 102 and a folding portion 100f disposed therebetween. The folding portion 100f may be formed as a folding line crossing from an end of one side of the display panel 100 to an end of the other side thereof in a Y-axis direction (i.e., the length direction of the display panel 100) or an X-axis direction (i.e., the width direction of the display panel 100). The folding line includes a buffer portion which will be described in aspects. The display panel 100 may be bent or folded due to an external force based on the folding portion 100f. When the thickness of the glass substrate of the display panel 100 is small, the display panel 100 may be flexibly bent at a sufficiently large curvature even by a small force.

According to the present disclosure, the folding portion 100f includes glass having a thickness that is less than or equal to a thickness of glass of each of the non-folding portions 101 and 102, and thus rigidity of the folding portion 100f is improved and a difference in refractive index between the folding portion 100f and the non-folding portions 101 and 102 is reduced. According to the present disclosure, an organic material may be added to at least a part of the folding portion 100f so as to allow the folding portion 100f to be easily bent in the display panel 100. A resin material having high stretchability, for example, one among polyurethane, acrylic, and silicone synthetic rubber or a mixed material of two or more thereamong may be employed as the organic material. An example of silicone synthetic rubber may include polydimethylsiloxane (PDMS).

The display panel 100 may include the folding portion 100f and the non-folding portions 101 and 102. One or more of the non-folding portions 101 and 102 may include a display portion on which an input image is reproduced. The non-folding portions 101 and 102 may have different sizes. In the example of FIG. 1, a first non-folding portion 101 may include a pixel array which displays an image. A second non-folding portion 102 may include an integrated circuit (IC) mounting region on which a drive IC for driving pixels is mounted. At least a part of the second non-folding portion 102 may include a pixel array which displays an image or preset additional information.

Figure 3:
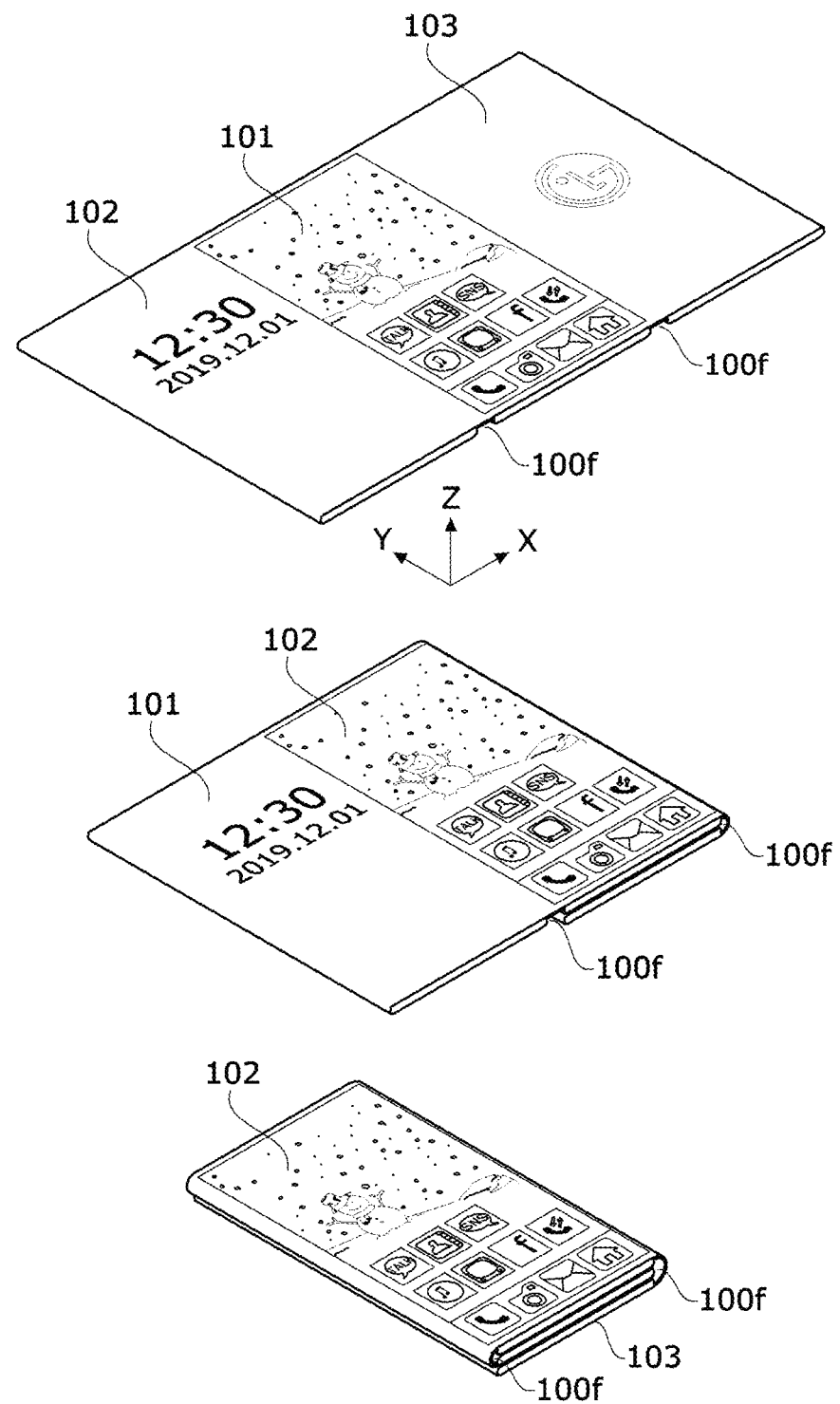

When the second non-folding portion 102 is used as an IC mounting region, in the case of the folding portion 100f is bent at a high curvature, the second non-folding portion 102 may be out-folded to a surface opposite to a display surface, on which an image is displayed, for example, a display surface of the first non-folding portion 101. The examples of FIGS. 2 and 3 show folding portions 100f disposed between three non-folding portions 101, 102, and 103 in a foldable display. Each of the non-folding portions 101, 102, and 103 includes a pixel array which displays an image or information. As described above, the folding portions 100f may each include glass and an organic material.

Figure 4:
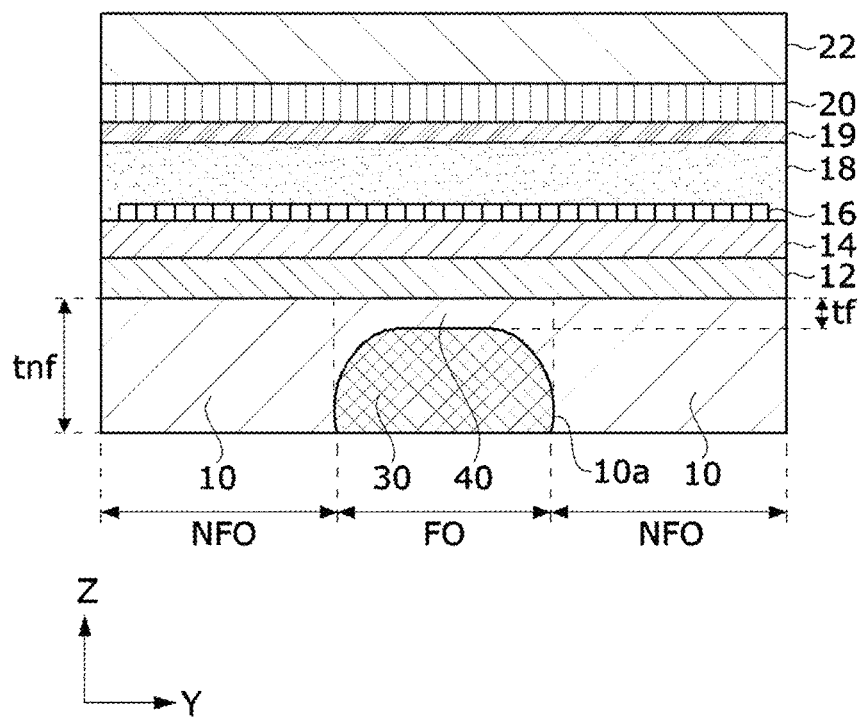
FIG. 4 is a cross-sectional view illustrating a flexible display panel according to a first aspect of the present disclosure.

FIG. 4 is a cross-sectional view illustrating a flexible display panel according to a first aspect of the present disclosure.

Referring to FIG. 4, a display panel 100 includes a glass substrate 10, an organic film 12 disposed on the glass substrate 10, and a circuit layer 14 and a light-emitting element layer 16 which are stacked on the organic film 12. The display panel 100 may further include an encapsulation layer 18 covering the circuit layer 14 and the light-emitting element layer 16, a polarizing plate 20, and a cover window 22. A touch screen in which touch sensors are disposed may be implemented on the display panel 100. Lines of the touch sensors omitted from the drawing may be disposed between the encapsulation layer 18 and the polarizing plate 20.

The organic film 12 may be a film including one selected from the group consisting of a polyimide-based polymer, a polyester-based polymer, a silicone-based polymer, an acrylic-based polymer, a polyolefin-based polymer, and a copolymer thereof. Since polyimide has acid resistance and heat resistance, polyimide may be applied in a high-temperature process of the circuit layer 14 and the light-emitting element layer 16. As in aspects which will be described below, since the circuit layer 14 may be directly formed on the glass substrate 10, the organic film 12 may be omitted.

The circuit layer 14 may include pixel circuits connected to data lines, gate lines, and power lines, and gate drivers connected to the gate lines. The pixel circuit and the gate driver may include circuit elements such as a thin film transistor (TFT) and a capacitor. In order to reduce a tensile force and stress applied to the circuit layer 14 when a folding portion FO is bent, the circuit layer 14 in the folding portion FO may include only lines such as the data lines, the gate lines, and power lines.

The light-emitting element layer 16 may include an organic light-emitting diode (OLED) which is driven by a driving element of the pixel circuit. The OLED includes an organic compound layer formed between an anode and a cathode. The organic compound layer may include a hole injection layer (HIL), a hole transport layer (HTL), an emission layer (EML), an electron transport layer (ETL), and an electron injection layer (EIL), but the present disclosure is not limited thereto. When a voltage is applied to the anode and the cathode of the OLED, holes passing through the HTL and electrons passing through the ETL move to the EML to form excitons so that visible light is emitted from the EML. The light-emitting element layer 16 may further include a color filter array which selectively transmits red, green, and blue wavelengths.

The light-emitting element layer 16 and circuit layer 14 may be covered by a protective layer which is omitted from the drawing. Each of the protective layer and the encapsulation layer 18 may be formed of an inorganic layer made of glass, a metal, aluminum oxide ($AlO_x$), or a silicon (Si)-based material, or may have a structure in which an organic layer and an inorganic layer are alternately stacked. The inorganic layer blocks infiltration of moisture or oxygen. The organic layer planarizes a surface of the inorganic layer. When the organic layer and the inorganic layer are stacked in multiple layers, a movement path of moisture or oxygen becomes longer than a movement path of a single layer so that the infiltration of moisture/oxygen affecting the light-emitting element layer 16 may be effectively blocked.

The polarizing plate 20 may be bonded to the encapsulation layer 18 using an adhesive 19. The polarizing plate 20 improves outdoor visibility of the display device. The polarizing plate 20 reduces light reflected from a surface of the display panel 100 and blocks light reflected from a metal of the circuit layer 14, thereby improving brightness of the pixels. The polarizing plate 20 may be implemented as a linear polarizing plate, a polarizing plate to which a phase delay film is bonded, or a circular polarizing plate. The transparent cover window 22 may be disposed on the polarizing plate 20.

The glass substrate 10 may be made of a plate-shaped alkali-free glass or a plate-shaped non-alkali glass. The glass substrate 10 may be divided into the folding portion FO and a non-folding portion NFO. The non-folding portion NFO of the glass substrate 10 is made of glass only.

The folding portion FO of the glass substrate 10 includes one or more buffer portions. The buffer portion includes glass 40 and an organic filler 30. For example, a part of the glass 40 may be removed from the folding portion FO of the glass substrate 10 to form a hole 10a, and the hole 10a may be filled with the organic filler 30. The organic filler 30 may include a resin material having high stretchability. The glass 40 of the folding portion FO may be in contact with the organic film 12. When the organic film 12 is omitted, the glass 40 of the folding portion FO may be in contact with the circuit layer 14.

The organic filler 30 improves stretchability in the folding portion FO to absorb stress applied to the glass substrate 10 even when the display panel 100 is bent at a high curvature. The glass 40 of the folding portion FO enhances the rigidity of the glass substrate 10 in the folding portion FO. The combination of the organic filler 30 and the glass 40 allows the folding portion FO to be easily bent at a high curvature in the display panel 100 and reinforces rigidity of the glass substrate 10, thereby reducing a strain of the glass substrate 10. Thus, according to the present disclosure, even when the display panel 100 is folded at a high curvature, the strain of the glass substrate 10 may be reduced to prevent a phenomenon in which folded creases or hinge stains are visible.

In FIG. 4, a glass thickness tf of the folding portion FO is smaller than a glass thickness tnf of the non-folding portion NFO, but the present disclosure is not limited thereto. For example, when the glass 40 is patterned in the folding portion FO and a concave portion (i.e., the hole 10a) of the folding portion FO is filled with the organic filler 30, a thickness of the glass pattern may be set to be less than or equal to a thickness of the glass 40 in the non-folding portion NFO. An example of FIG. 5 shows an example of the glass pattern in the folding portion FO.

Figure 5:
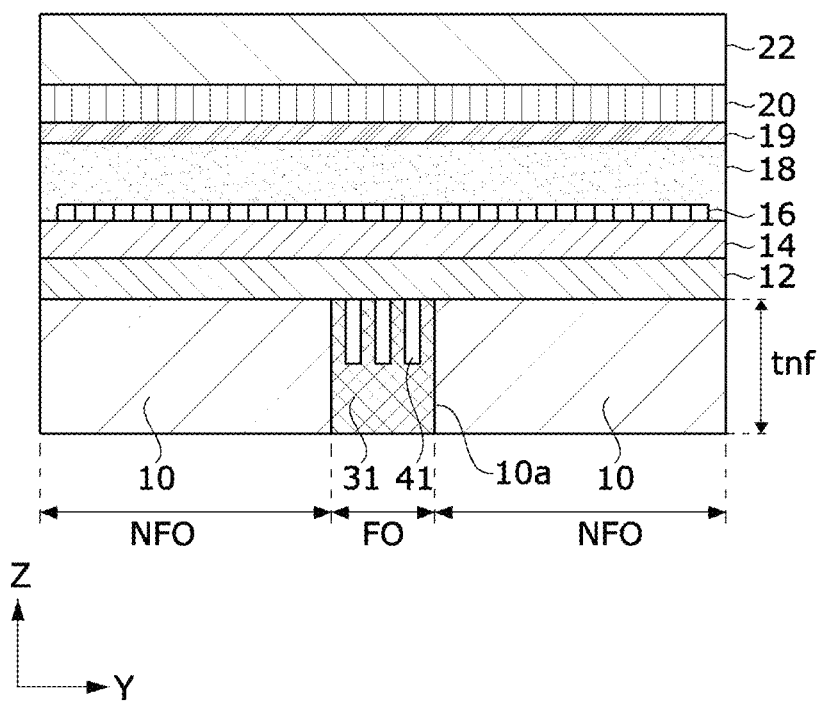
FIG. 5 is a cross-sectional view illustrating a flexible display panel according to a second aspect of the present disclosure.

FIG. 5 is a cross-sectional view illustrating a flexible display panel according to a second aspect of the present disclosure. In FIG. 5, components which are substantially the same as those of the first aspect are assigned to the same reference numerals, and detailed descriptions thereof will be omitted herein.

Referring to FIG. 5, a folding portion FO of a glass substrate 10 includes a glass pattern 41 and an organic filler 31 filling a hole 10a of the folding portion FO. The glass pattern 41 disposed in the hole 10a of the folding portion FO may be in contact with an organic film 12 or a circuit layer 14.

Figure 6:
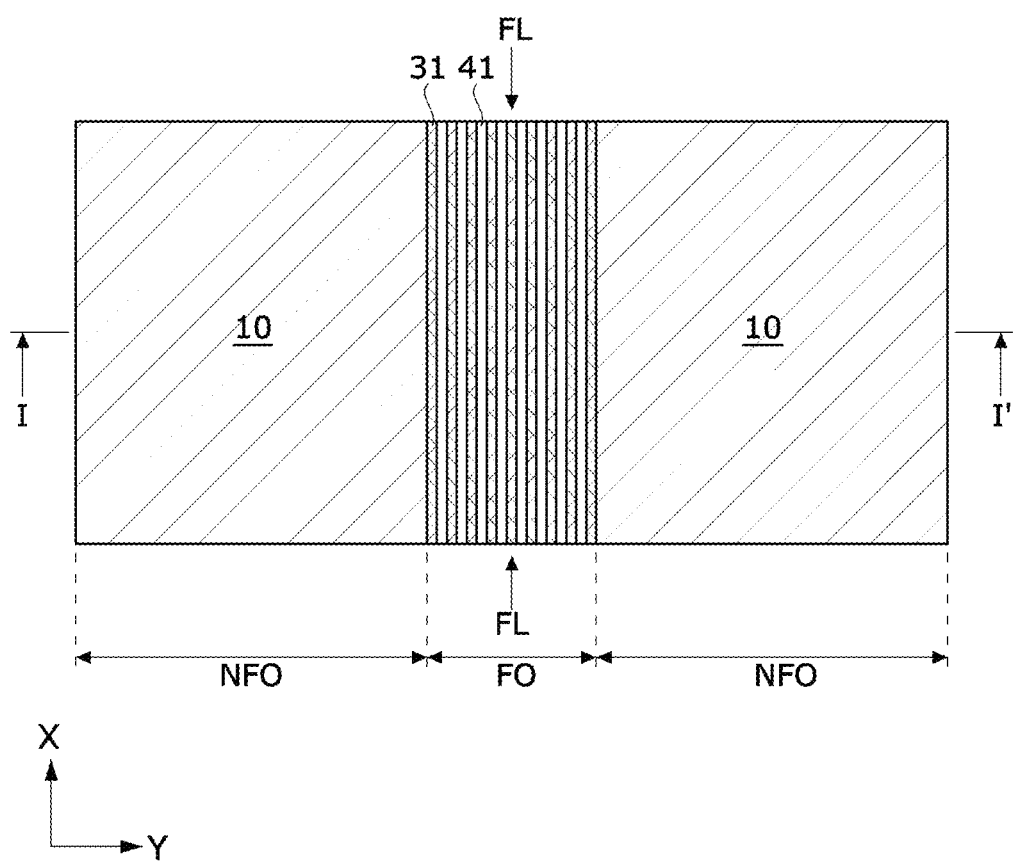
FIG. 6 is a plan view illustrating one example of a glass pattern.

As shown in FIG. 6, when a display panel 100 is viewed from above, the hole 10a of the folding portion FO may be in the form of a line formed along the glass pattern 41 patterned in the form of a stripe parallel to a folding line FL in the X-axis direction, but the present disclosure is not limited thereto.

FIG. 6 is a plan view illustrating one example of the glass pattern. FIG. 7 shows cross-sectional views illustrating the glass substrate 10 taken along line "I-I" of FIG. 6.

As shown in FIG. 6, when a length direction (i.e., the X-axis direction) of the glass pattern 41 is parallel to the folding line FL, the folding portion FO is easily bent in the Y-axis direction orthogonal to the folding line FL in the display panel 100. Meanwhile, due to the glass pattern 41, rigidity is increased in the X-axis direction parallel to the folding line FL so that the display panel 100 is not easily bent in the X-axis direction.

A thickness of the glass pattern 41 may be appropriately set to be less than or equal to a glass thickness tnf of a non-folding portion NFO according to a curvature and rigidity which are required in the folding portion FO. (a) of FIG. 7 illustrates an example in which the thickness of the glass pattern 41 is the same as the glass thickness tnf of the non-folding portion NFO, and (b) of FIG. 7 illustrates an example in which the thickness of the glass pattern 41 is smaller than the glass thickness tnf of the non-folding portion NFO. The thickness and an interval of the glass pattern 41 may be controlled through an etching method of the glass substrate 10.

Figure 8:
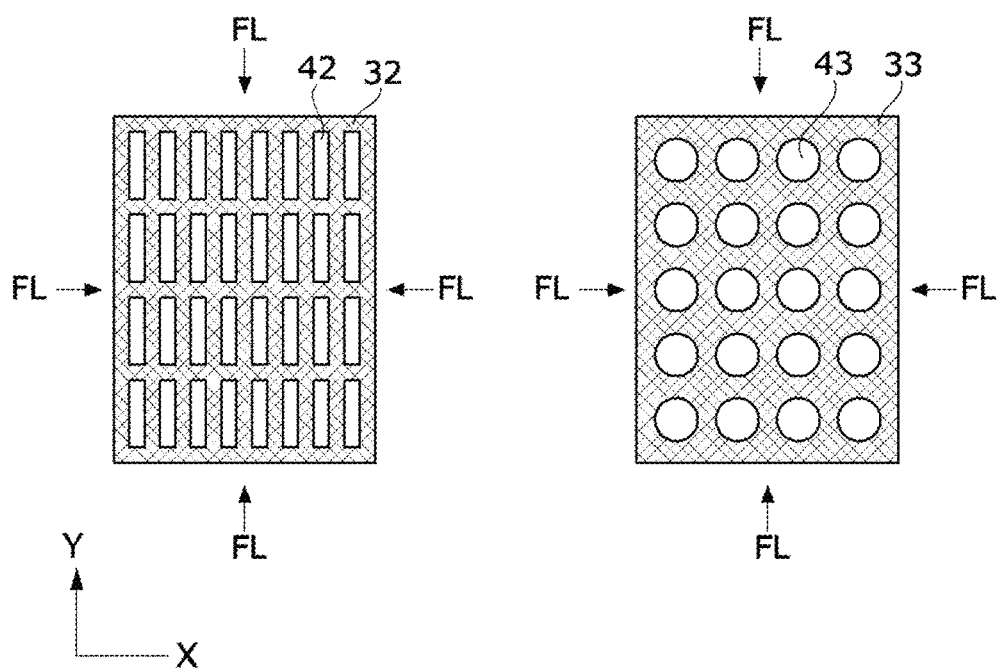
FIG. 8 is a plan view illustrating another example of the glass pattern.

FIG. 8 is a plan view illustrating another example of the glass pattern.

Referring to FIG. 8, glass patterns 42 and 43 disposed in the hole 10a of the folding portion FO may be patterned in the form of a square column or a cylindrical column disposed in a matrix form. The glass patterns 42 and 43 are disposed in the hole 10a of the folding portion FO and filled with organic fillers 32 and 33. The folding portion FO having such a structure may be bent at a boundary of folding lines FL in a biaxial direction (a X-axis direction and a Y-axis direction), and rigidity may be increased due to the glass patterns 42 and 43 in the biaxial direction.

According to the present disclosure, in order to reduce the thickness of the glass substrate 10 or process the hole 10a of the folding portion FO in the glass substrate 10 or a sidewall of an edge of the glass substrate 10 into a desired shape, the glass substrate 10 may be etched by a wet etching method.

Figure 9:
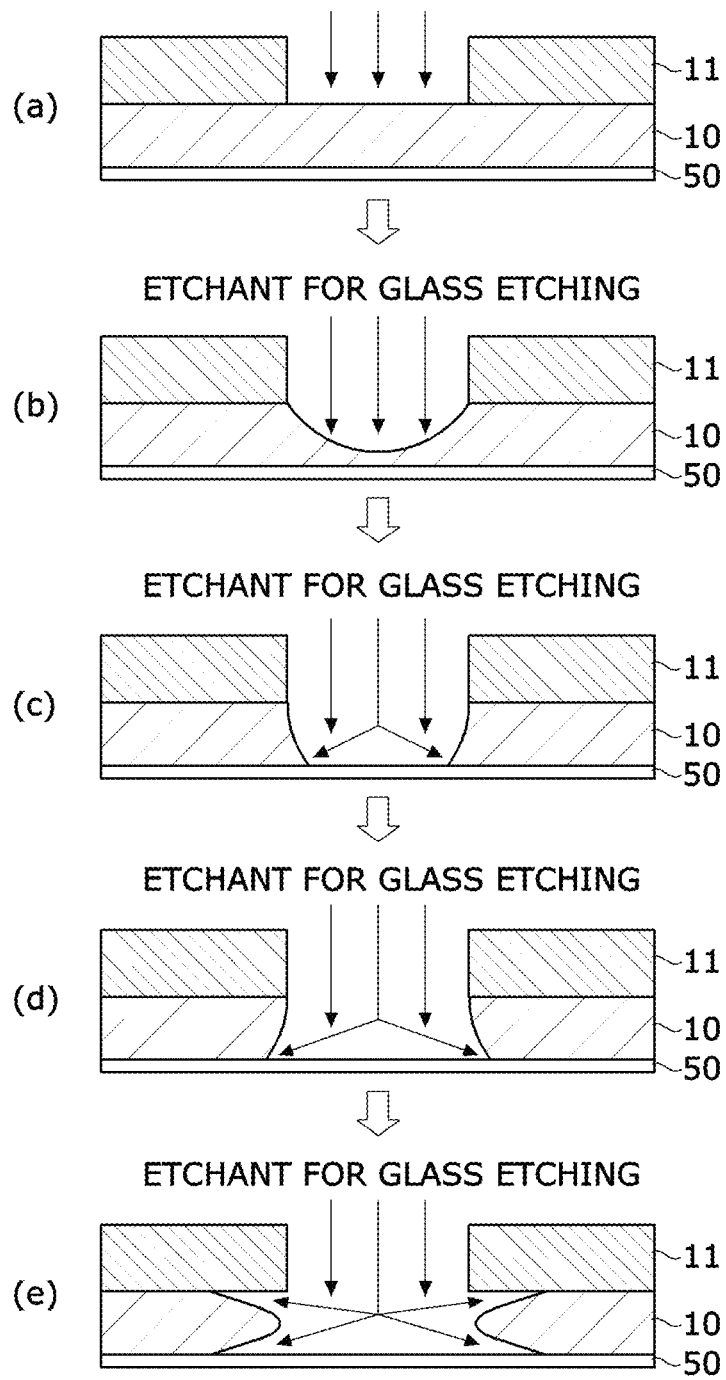

FIGS. 9 and 10 are diagrams illustrating an etching method of the glass substrate 10.

A mask film 11 may be disposed on one surface of the glass substrate 10, and an anti-etching film 50 may be disposed on the other surface of the glass substrate 10. The mask film 11 and the anti-etching film 50 may be organic films applied on or bonded to the glass substrate 10. The anti-etching film 50 may serve as an etch stopper in the etching process and may be the organic film 12 of the above-described aspect. The mask film 11 may include an aperture hole exposing the glass substrate 10 to an etchant for glass etching (etching solution). Shape, thicknesses, and intervals of the glass patterns 40 to 43 may be determined according to a shape and an interval of the aperture holes and an etching process time. The mask film 11 may be removed after the etching process.

According to the present disclosure, the glass substrate 10 may be etched such that an etchant is sprayed onto the glass substrate 10 to which the mask film 11 is bonded or the glass substrate 10 is put into a water tank including the etchant through a dipping method.

An etchant is supplied to the glass substrate 10 through the aperture hole of the mask film 11. As shown in (a) of FIG. 9, the glass substrate 10 exposed due to the aperture hole of the mask film 11 reacts to the etchant and starts to be etched. As shown in (b) of FIG. 9, the glass substrate 10 exposed to the etchant is etched to form the hole 10a in the glass substrate 10, and as the etching process time elapses, a depth of the hole 10a is increased as shown in (c) of FIG. 9. When the etching process time becomes longer in the etching process, as shown in of (d) and (e) of FIG. 9, the etchant infiltrates between the glass substrate 10 and the anti-etching film 50 and between the glass substrate 10 and the mask film 11 so that a tapered surface may be formed on a sidewall glass of the hole 10a.

The hole 10a and a residual glass film (or glass pattern) may be formed at a desired depth h in the folding portion FO using such a glass etching method. As shown in FIG. 10, when the aperture hole of the mask film 11 is small, the depth h of the hole 10a formed in the glass substrate 10 is decreased. In this case, a thickness of the glass pattern 41 disposed in the hole 10a is increased and the number of glass patterns 41 may be increased. On the other hand, when the aperture hole of the mask film 11 is large, the depth h of the hole 10a formed in the glass substrate 10 is increased and the thickness of the glass pattern 41 is decreased.

In the flexible display panel of the present disclosure, glass remains in the folding portion FO as well as the non-folding portion NFO. Consequently, surface rigidity is enhanced in the folding portion FO so that fold creases or hinge stains may be reduced.

Figure 11:
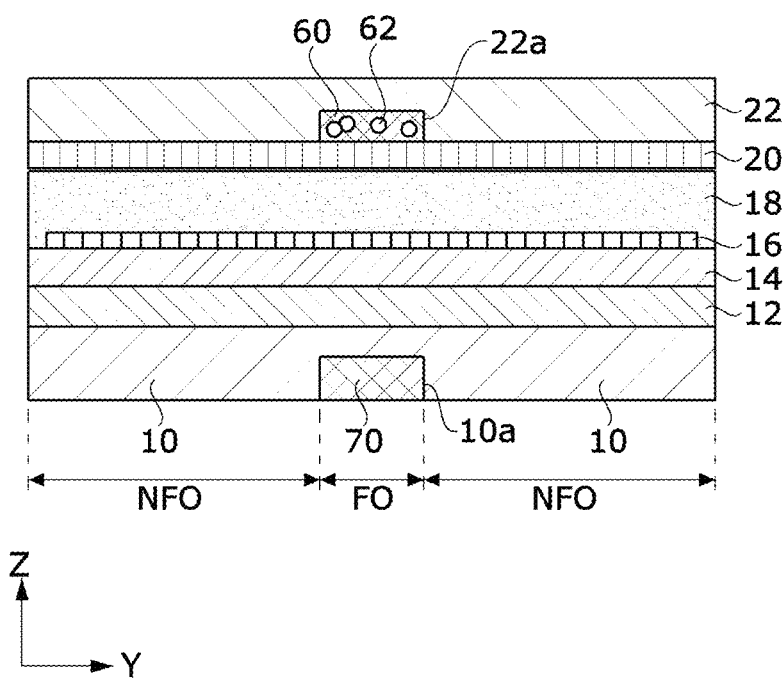
FIG. 11 is a cross-sectional view illustrating a flexible display panel according to a third aspect of the present disclosure.

FIG. 11 is a cross-sectional view illustrating a flexible display panel according to a third aspect of the present disclosure. In FIG. 11, components which are substantially the same as those of the above-described aspects are assigned to the same reference numerals, and detailed descriptions thereof will be omitted herein.

Referring to FIG. 11, a display panel 100 includes a glass substrate 10, an organic film 12 disposed on the glass substrate 10, and a circuit layer 14 and a light-emitting element layer 16 which are stacked on the organic film 12. The display panel 100 may further include an encapsulation layer 18 covering the circuit layer 14 and the light-emitting element layer 16, a polarizing plate 20, and a cover window 22.

The glass substrate 10 may be divided into a folding portion FO and a non-folding portion NFO. The folding portion FO of the glass substrate 10 includes one or more buffer portions, and the buffer portion includes a hole 10a filled with an organic filler 70. Glass may remain in the hole 10a. The glass may be in the form of a residual film remaining after an etching process or in the form of a glass pattern. In the buffer portion of the glass substrate 10, beads omitted in the drawing may be added to the organic filler 70. The beads may be made of a quantum dot (QD) material.

The cover window 22 may include one or more buffer portions. The buffer portion may include a hole 22a filled with an organic filler 60. The hole 22a of the cover window 22 may be formed by partially etching the cover window 22. The hole 22a includes beads 62 made of an inorganic material. The beads 62 may increase an elastic modulus of the folding portion FO to increase rigidity of the folding portion FO and reduce a difference in refractive index between the non-folding portion NFO and the folding portion FO. The beads 62 may scatter light to solve a phenomenon in which the organic fillers 60 and 70 filling the holes 10a and 22a are shown in the folding portion FO.

Due to the organic fillers 60 and 70, color reproducibility in the folding portion FO may be degraded. To solve the above problem, the beads 62 may include a QD material.

The QD material may be a material made of a group II-VI semiconductor compound, a group III-V semiconductor compound, a group IV-VI semiconductor compound, a group IV element or compound, or a combination thereof. For example, the II-VI semiconductor compound may be selected from the group consisting of a binary compound selected from the group consisting of CdSe, CdTe, ZnS, ZnSe, ZnTe, ZnO, HgS, HgSe, HgTe, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, and a mixture thereof, and a quaternary compound selected from the group consisting of CdZnSeS, CdZnSeTe, CdZnSTe, CdHgSeS, CdHgSeTe, CdHgSTe, HgZnSeS, HgZnSeTe, HgZnSTe, and a mixture thereof. The group III-V semiconductor compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof, and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The group IV-VI semiconductor compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The group IV element or compound may be selected from the group consisting of an elemental compound selected from the group consisting of Si, Ge, and a mixture thereof, and a binary compound selected from the group consisting of SiC, SiGe, and a mixture thereof.

The QD material is a semiconductor material having a crystal structure that is smaller in size than a Bohr exciton radius. Although a large number of electrons are present in the QD material, the number of free electrons is in a range of about 1 to 100. QDs are generated due to excitation of photons. When light is radiated onto a QD material from the light-emitting element layer 16, photons are excited in the QD material to jump to a higher energy band so that a fall back occurs or photons recombine to emit light.

Since energy levels of the electrons of the QD material are discontinuous, the QD material exhibits electrical and optical characteristics different from electrical and optical characteristics of a bulk semiconductor forming a continuous band. QD beads have different energy levels according to their size. A bandgap may be varied according to the size of the QD bead. A light emission wavelength may be controlled in a visible light range by simply adjusting sizes of the QD beads 62 which are added to the folding portion FO. Thus, according to the present disclosure, not only may rigidity of the folding portion FO be reinforced using the QD beads 62, but also color reproducibility of the folding portion FO may be improved and a viewing angle may be increased using the organic fillers 60 and 70.

Although omitted in FIG. 11, beads may be added to the folding portion FO of the glass substrate 10, and QDs may be included in the beads.

Image quality of a liquid crystal display device may be improved using the QDs. In this case, a QD film should be located between a backlight unit and a polarizing plate below a display panel. When the QD film is located between an upper polarizing plate and the lower polarizing plate of the display panel, polarized light passing through the lower polarizing plate is offset due to the QD film such that an image cannot be properly reproduced on the display panel. In contrast, according to the present disclosure, the QD material is disposed on the display panel 100. In particular, as shown in FIG. 11, it should be noted that the display panel 100 has a structure in which the QD material is in contact with the polarizing plate 20 disposed on the light-emitting element layer 16 or the QD material is disposed on the polarizing plate 20.

Figure 12:
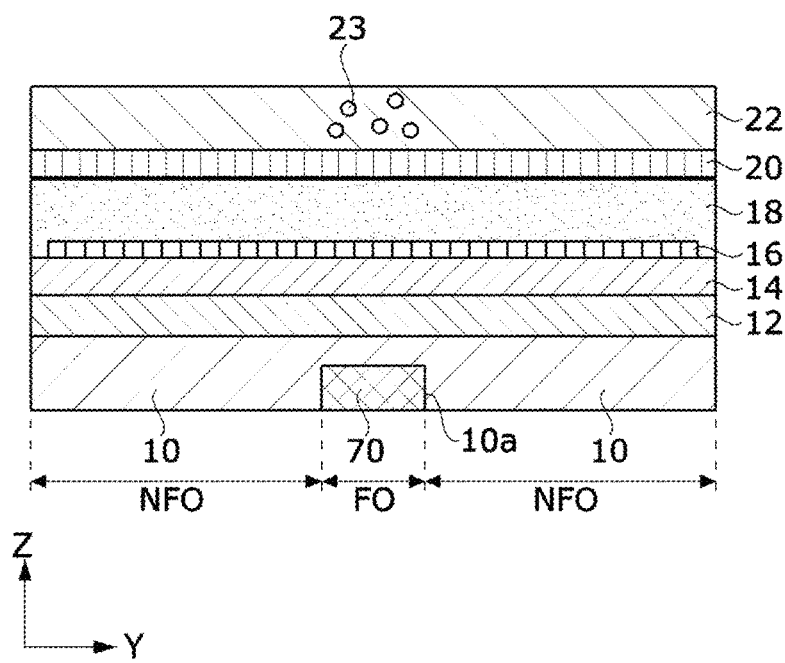
FIG. 12 is a cross-sectional view illustrating a flexible display panel according to a fourth aspect of the present disclosure.

FIG. 12 is a cross-sectional view illustrating a flexible display panel according to a fourth aspect of the present disclosure. In FIG. 12, components which are substantially the same as those of the above-described aspects are assigned to the same reference numerals, and detailed descriptions thereof will be omitted herein.

Referring to FIG. 12, a cover window 22 may include one or more beads 23 in a folding portion FO. The beads 23 may include a QD material so as to improve color reproducibility and a viewing angle of the folding portion FO. A wavelength of light emitted from the QD material may be varied to a desired wavelength by adjusting a size of the QD material.

Figure 13:
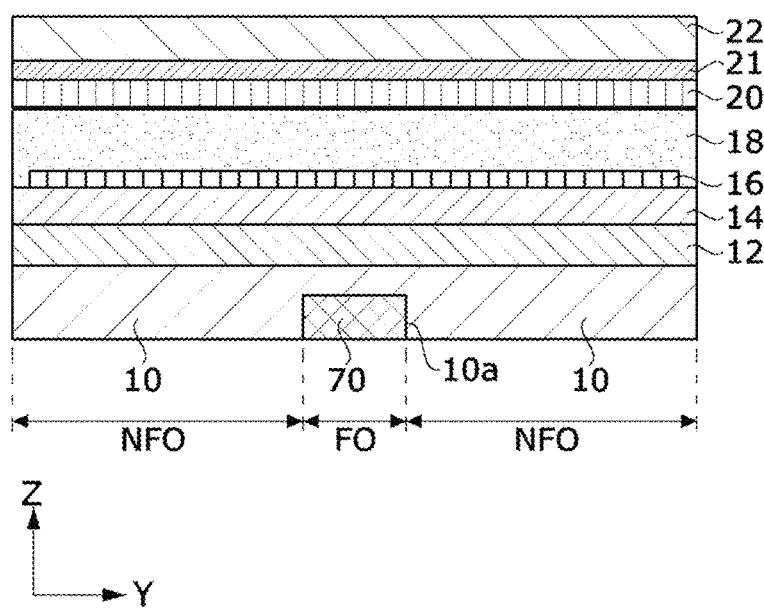
FIG. 13 is a cross-sectional view illustrating a flexible display panel according to a fifth aspect of the present disclosure.
Figure 14:
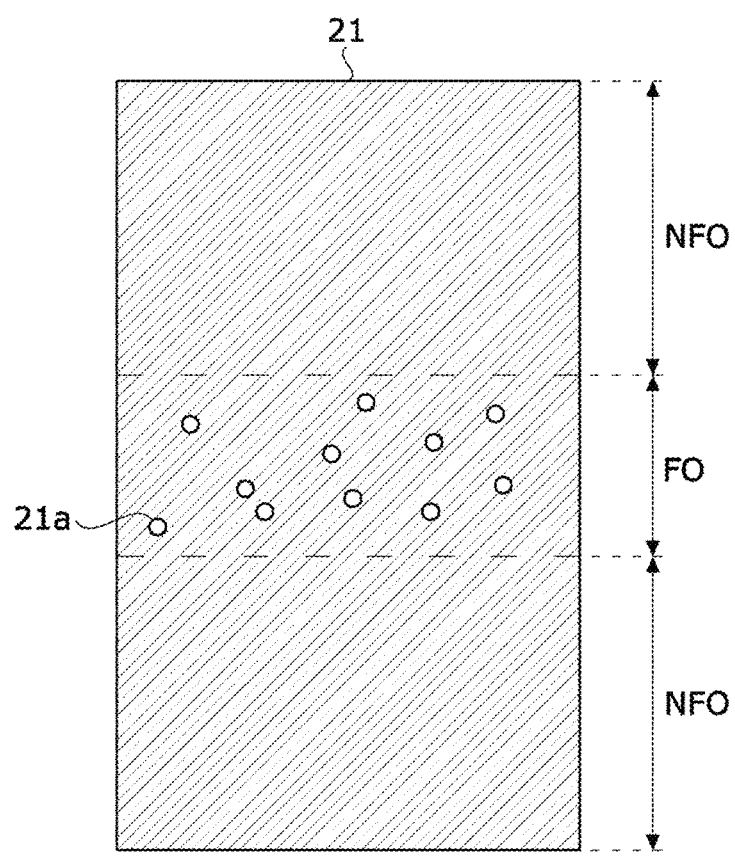
FIG. 14 is a plan view illustrating an example of beads dispersed in a bead film shown in FIG. 13.

FIG. 13 is a cross-sectional view illustrating a flexible display panel according to a fifth aspect of the present disclosure. In FIG. 13, components which are substantially the same as those of the above-described aspects are assigned to the same reference numerals, and detailed descriptions thereof will be omitted herein. FIG. 14 is a plan view illustrating an example of beads dispersed in a bead film shown in FIG. 13.

Referring to FIGS. 13 and 14, a display panel 100 includes a bead film 21 disposed between a polarizing plate 20 and a cover window 22. A plurality of beads 21a including an inorganic material or a QD material may be dispersed in the bead film 21. The beads 21a may be disposed in a non-folding area NFO and a folding area FO, and alternatively, as shown in FIG. 14, the beads 21a may be disposed in only the folding area FO. The QD beads 21a dispersed in the bead film 21 improve color reproducibility and a viewing angle of an image reproduced in a pixel array.

The inventors of the present application repeated a simulation so as to check stress and strain which were generated in a folding portion when thicknesses of an organic filler and glass were varied in the folding portion of a display panel. According to the simulation result, when a ratio of the thickness of the organic filler to the thickness of the glass was 6:4 in the folding portion FO, it was measured as an ideal neutral state without stress when the folding portion FO was bent at a required curvature. According to the simulation result, when the ratio of the thickness of the organic filler to the thickness of the glass was in a range of 6 to 10:4 to 9, it was confirmed as a neutral state or strain similar to the neutral state. Therefore, the thickness of the organic filler and the thickness of the glass in the folding portion FO may be set according to the above thickness ratio.

Figure 17:
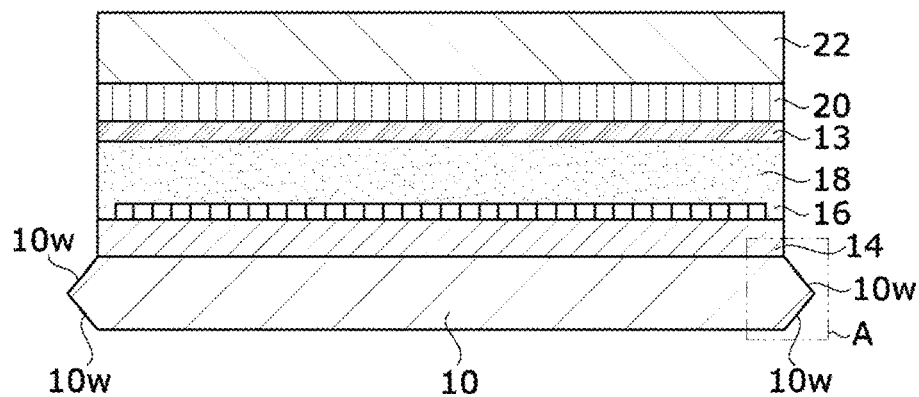
FIG. 17 is a cross-sectional view illustrating a flexible display panel according to an eighth aspect of the present disclosure.
Figure 18:
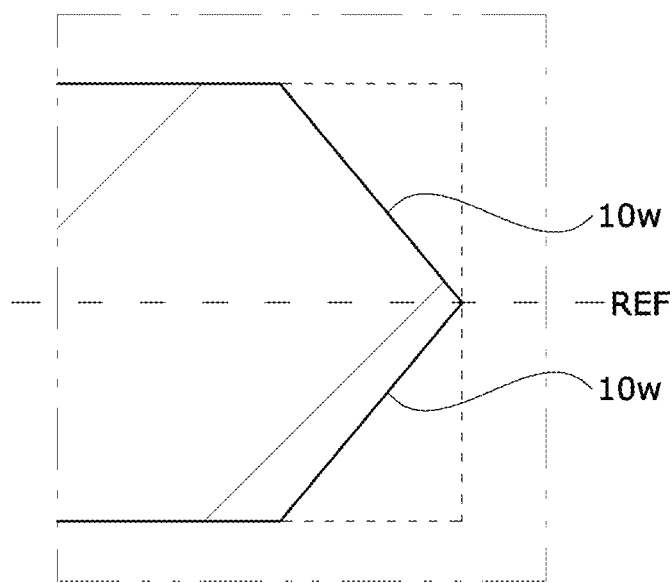
FIG. 18 is an enlarged view illustrating a wedge-type sidewall portion A of a substrate in FIG. 17.

When the folding portion FO of the display panel 100 is bent, since a curvature is partially different in the folding portion FO, a force applied to the folding portion FO is different for each position so that stretchability and rigidity required for each position of the folding portion FO may be different. In consideration of the above description, as shown in FIGS. 17 and 18, when the folding portion FO is folded, the thickness of the glass may be differently set according to the position of the folding portion FO in consideration of a difference in force and strain applied to each position of the folding portion FO.

The folding portion of the flexible display panel may need to be reinforced according to an application, and in contrast, stretchability may be regarded as being important.

Figure 15A:
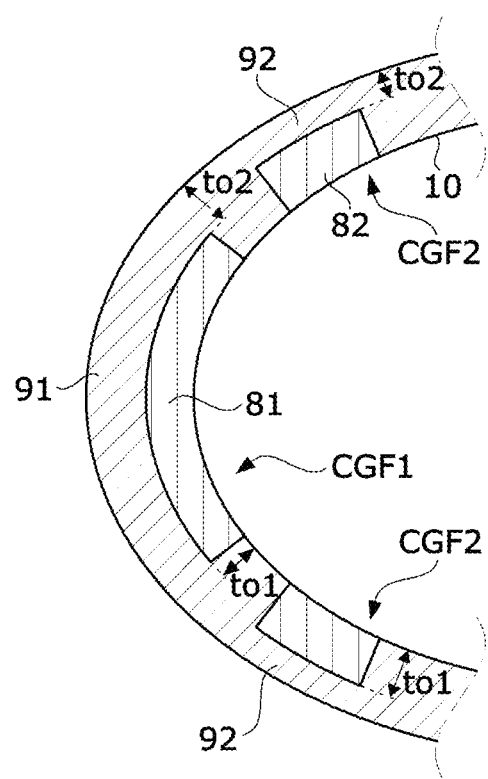
FIGS. 15A and 15B are cross-sectional views illustrating a flexible display panel according to a sixth aspect of the present disclosure.
Figure 15:
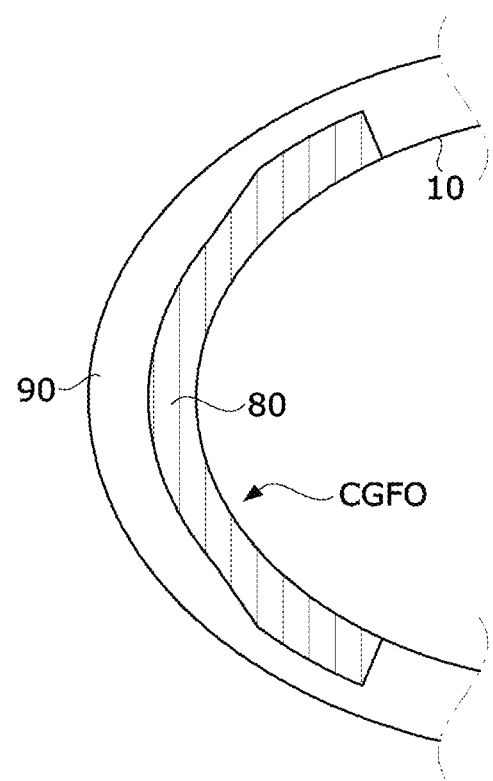

FIGS. 15A and 15B are cross-sectional views illustrating a flexible display panel according to a sixth aspect of the present disclosure. In FIGS. 15A and 15B, "t01" is a thickness of each of organic fillers 81 and 82, and "t02" is a thickness of glass.

As shown in FIG. 15A, a folding portion FO of a display panel 100 may include a plurality of buffer portions CGF1 and CGF2. The buffer portions CGF1 and CGF2 include holes filled with the organic fillers 81 and 82 and the glasses 91 and 92. The glasses 91 and 92 may be in the form of a residual film or a pattern as in the above-described aspects. When a folding portion FO is bent, a first buffer portion CGF1 which is located in a portion having the largest curvature may have the longest length or a thickness t02 of the glass may be set to be large. In contrast, a second buffer portion CGF2 located at a portion having a relatively small curvature may have the thickness t02 of the glass set to be relatively small.

As shown in FIG. 15B, the folding portion FO of the display panel 100 may include a buffer portion CGFO having partially different thicknesses of the glass. The buffer portion CGFO includes a hole filled with an organic filler 80 and glass 90. The glass 90 may be in the form of a residual film or a pattern as in the above-described aspects. When the folding portion FO is bent, a thickness t02 of the glass located in a portion having the largest curvature may be set to be large, and the thickness t02 of the glass located in a portion having a relatively small curvature may be set to be small. When the folding portion is frequently folded, such as in a foldable display, the examples shown in FIGS. 15A and 15B may further reinforce rigidity in a portion having a large curvature so as to prevent folded crease marks or hinge stains from being visible and may improve stretchability in a portion having a relatively small curvature.

Figure 16A:
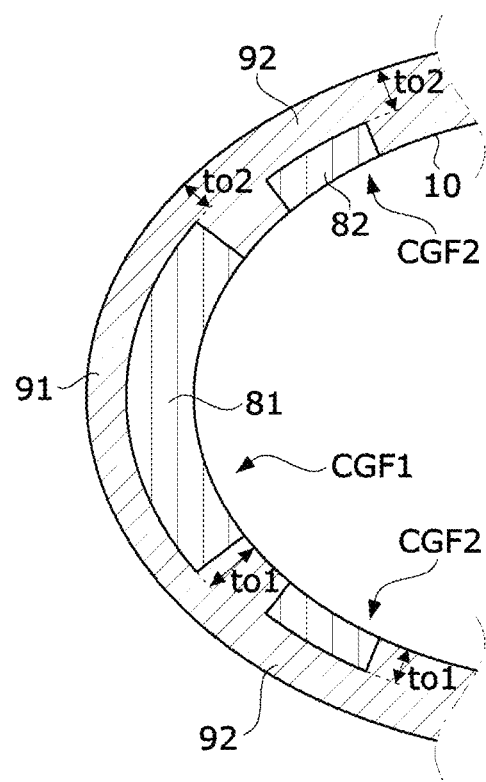
FIGS. 16A and 16B are cross-sectional views illustrating a flexible display panel according to a seventh aspect of the present disclosure.
Figure 16B:
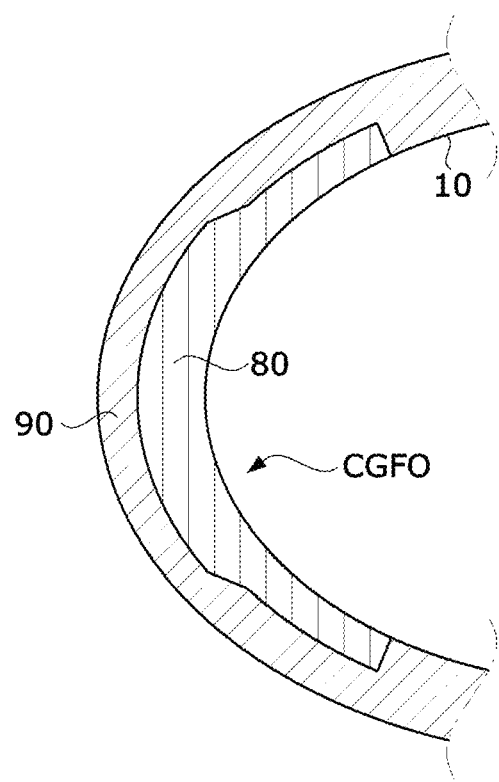

FIGS. 16A and 16B are cross-sectional views illustrating a flexible display panel according to a seventh aspect of the present disclosure.

As shown in FIG. 16A, a folding portion FO of a display panel 100 may include a plurality of buffer portions CGF1 and CGF2. The buffer portions CGF1 and CGF2 include holes filled with organic fillers 81 and 82 and glasses 91 and 92. The glasses 91 and 92 may be in the form of a residual film or a pattern as in the above-described aspects. When a folding portion FO is bent, a first buffer portion CGF1 which is located in a portion having the largest curvature may have the longest length or a thickness t02 of the glass may be set to be small. In contrast, a second buffer portion CGF2 located at a portion having a relatively small curvature may have the thickness t02 of the glass set to be relatively large.

As shown in FIG. 16B, the folding portion FO of the display panel 100 may include a buffer portion CGFO having partially different thicknesses of the glass. The buffer portion CGFO includes a hole filled with an organic filler 80 and glass 90. The glass 90 may be in the form of a residual film or a pattern as in the above-described aspects. When the folding portion FO is bent, a thickness t02 of the glass located in a portion having the largest curvature may be set to be small, and the thickness t02 of the glass located in a portion having a relatively small curvature may be set to be large.

When there is no situation in which the folding portion is unfolded once the folding portion is folded, such as a bezel bended display, the examples shown in FIGS. 16A and 16B may improve stretchability in a portion having a large curvature so as to reduce stress of the folding portion and improve rigidity in a portion having a relatively small curvature.

In the above-described aspects, the glass substrate 10 may be made to have a sufficiently thin thickness so as to be bent at a required curvature of an application product. The thin glass substrate 10 is flexibly bendable and has characteristics of acid resistance and heat resistance. Thus, according to the present disclosure, the circuit layer 14 may be directly mounted on the thin glass substrate 10 without the organic film 12.

The thin glass substrate 10 is flexible, but when an impact is applied to sidewalls and corners of an edge, cracks or breakage may occur in the thin glass substrate 10. According to the present disclosure, as shown in FIGS. 17 and 18, in order to distribute an impact or stress applied from the outside in a weak portion of the thin glass substrate 10, the sidewalls of the edge of the glass substrate 10 may be processed in the form of a wedge.

FIG. 17 is a cross-sectional view illustrating a flexible display panel according to an eighth aspect of the present disclosure. FIG. 18 is an enlarged view illustrating a wedge-type sidewall portion A in FIG. 17. In FIGS. 17 and 18, a buffer portion of a folding portion FO is omitted. In the present aspect, a structure of the buffer portion may be implemented in any one of the above-described aspects or a combination thereof.

Referring to FIGS. 17 and 18, the display panel 100 includes a glass substrate 10, a circuit layer 14 stacked on the glass substrate 10, and a light-emitting element layer 16. The display panel 100 may further include an encapsulation layer 18 covering the circuit layer 14 and the light-emitting element layer 16, a polarizing plate 20, and a cover window 22. The display panel 100 may further include a touch sensor layer 13 disposed between the encapsulation layer 18 and the polarizing plate 20. Touch sensor lines connecting the touch sensors to the touch sensor driver may be formed in the touch sensor layer 13.

The glass substrate 10 may have a thin thickness, for example, 200 μm or less, so as to be flexibly bendable. In the above-described aspects, the organic film 12 formed on the glass substrate 10 may be omitted.

Sidewalls of edges of the glass substrate 10 may be machined into wedge type sidewalls. A sidewall of a corner at which two sides meet on the glass substrate 10 is also machined into a wedge type sidewall. As shown in FIG. 18, when viewed from a cross section of the edge of the glass substrate 10, the wedge type means a shape in which a tapered surface of an upper half-thickness portion of the glass substrate 10 is symmetrical to a tapered surface of a lower half-thickness portion thereof based on a thickness center REF of the glass substrate 10. Therefore, the thickness of the glass substrate 10 is gradually decreased in a direction from the edge toward the sidewall due to tapered surfaces 10w which are vertically symmetrical to each other. The tapered portion of the glass substrate 10 protrudes out of the circuit layer 14, and the thickness of the glass substrate 10 becomes thinner in a direction toward an end portion of the sidewall of the glass substrate 10.

Figure 19:
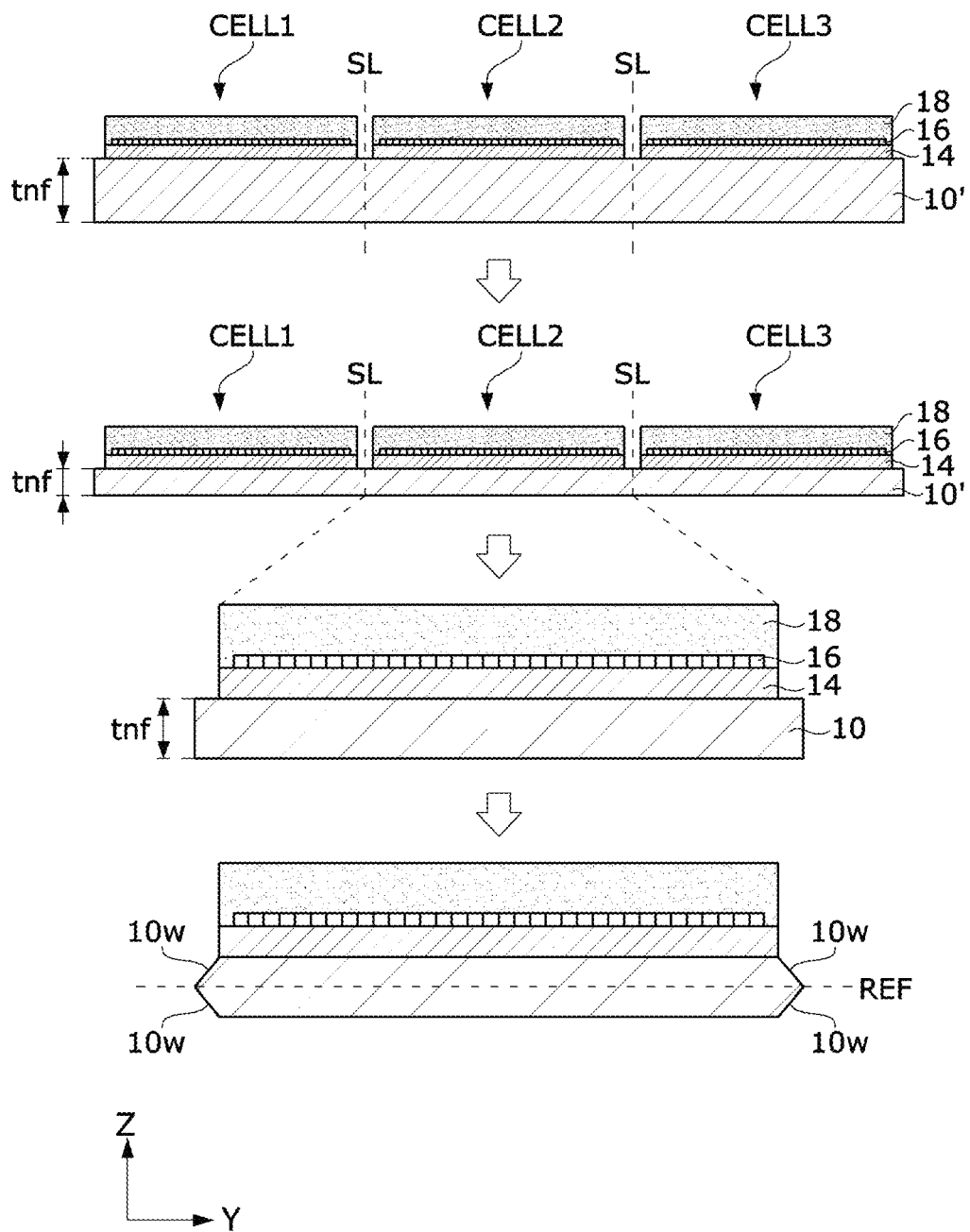
FIG. 19 is a diagram illustrating a process procedure of manufacturing a wedge-type sidewall of a glass substrate according to an aspect of the present disclosure.

FIG. 19 is a diagram illustrating a process procedure of manufacturing a wedge-type sidewall of a glass substrate according to an aspect of the present disclosure.

Referring to FIG. 19, a plurality of display panels 100 may be simultaneously manufactured through a multi-panel process in order to reduce a production cost.

A process of forming thin films in a plurality of cells CELL1 to CELL3 on a mother glass 10', which is a large glass substrate, is simultaneously performed. Here, one cell is a single unit of the display panel 100. The mother glass 10' is entirely etched to be implemented as a flexible substrate, and a thickness of the mother glass 10' may be reduced from 500 μm to 200 μm or less. In the plurality of cells CELL1 to CELL3 on the mother glass 10', the circuit layers 14 are simultaneously formed, the light-emitting element layers 16 are simultaneously formed, and then the encapsulation layers 18 are simultaneously formed. Subsequently, in a scribing process, the mother glass 10' is cut by a scribing wheel along a scribing line SL to be separated in cell units. After the scribing process, in a trimming process, a contour of each of the display panels 100 is trimmed using a laser cutting device.

When the thickness of the glass substrate 10 is decreased, the glass substrate 10 may become flexible, but the sidewall of the edge may be rough and uneven and thus cracks may propagate or be damaged due to a small impact. In the present disclosure, the edges of the glass substrates 10 of the display panels 100, which are separated by cell units, are etched. In this case, an entirety of a lower surface and sidewalls of the glass substrate 10 may be exposed to the etching solution, or only the sidewalls of the glass substrate 10 may be exposed to the etching solution. As shown in FIG. 19, as an etching process time increases, the tapered surface 10w begins to be formed on the edge of the glass substrate 10 exposed to the etching solution and, as the etching process time further increases, the tapered surface 10w becomes longer. When the lower surface of the glass substrate 10 is exposed to the etching solution in the etching process, the thickness of the glass substrate 10 is decreased and the tapered surface 10w becomes longer. The etching process is stopped when reaching a design thickness of the glass substrate 10 and a wedge shape of a cross section.

Figure 21:
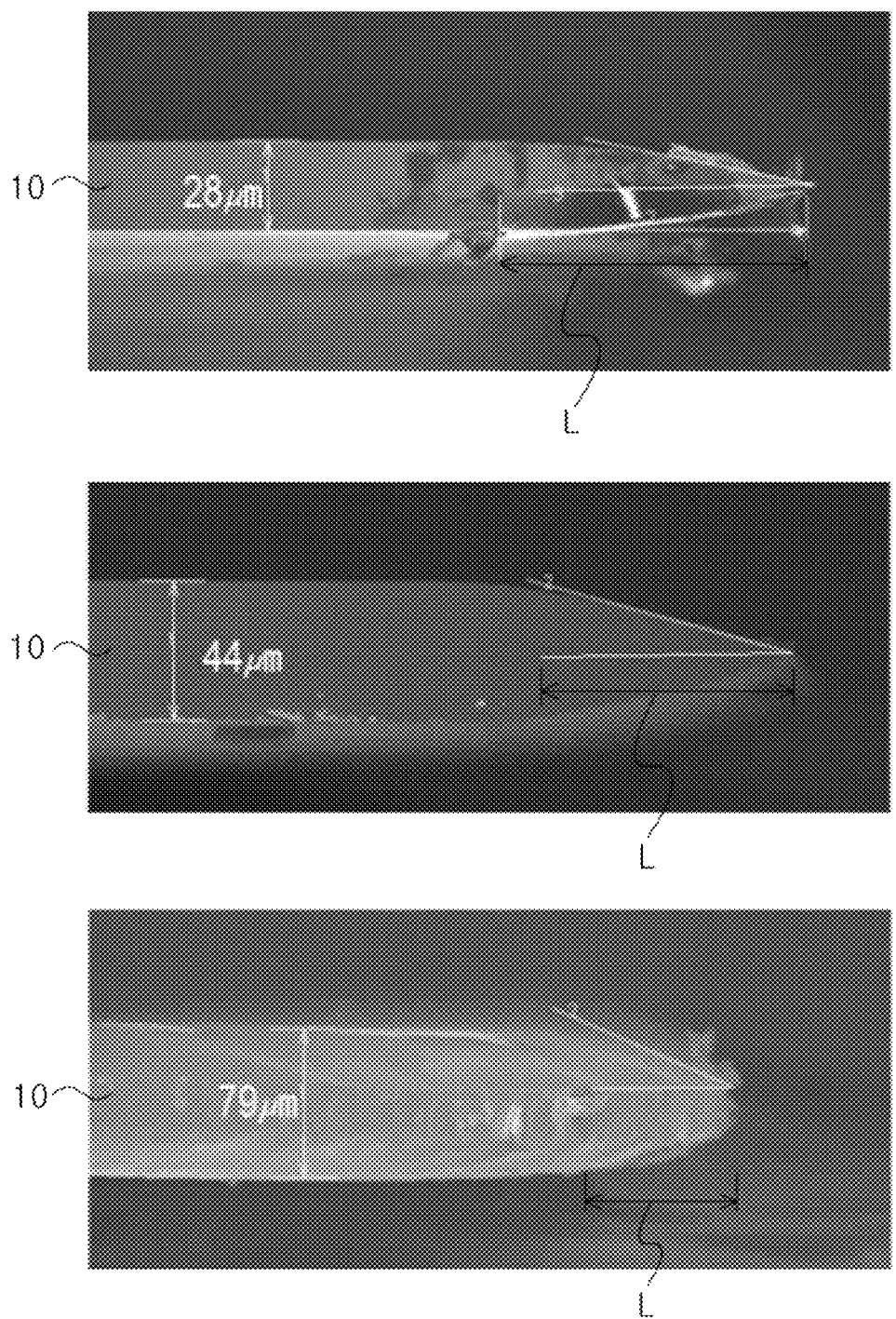
FIG. 21 shows cross-sectional photographs of the glass substrate that illustrate a tapered surface when a thickness of the glass substrate is decreased due to an etching process of the glass substrate.

FIG. 20 is a diagram illustrating various examples of a wedge-type sidewall of the glass substrate 10. FIG. 21 shows cross-sectional photographs of the glass substrate 10 that illustrate a tapered surface when the thickness of the glass substrate 10 is decreased due to an etching process of the glass substrate 10.

Referring to FIGS. 20 and 21, the wedge-type sidewall of the glass substrate 10 has the tapered surfaces 10w which are vertically symmetrical to each other based on the thickness center REF of the glass substrate 10. A length L of the tapered surface 10w may be determined according to the etching process time. As shown in the photographs of FIG. 21, when the lower surface of the glass substrate 10 is exposed to the etching solution in the etching process, as the thickness of the glass substrate 10 is decreased, a length L of the tapered surface 10w may be increased. Thus, the length L of the tapered surface 10w may be inversely proportional to the thickness of the glass substrate 10.

Figure 22:
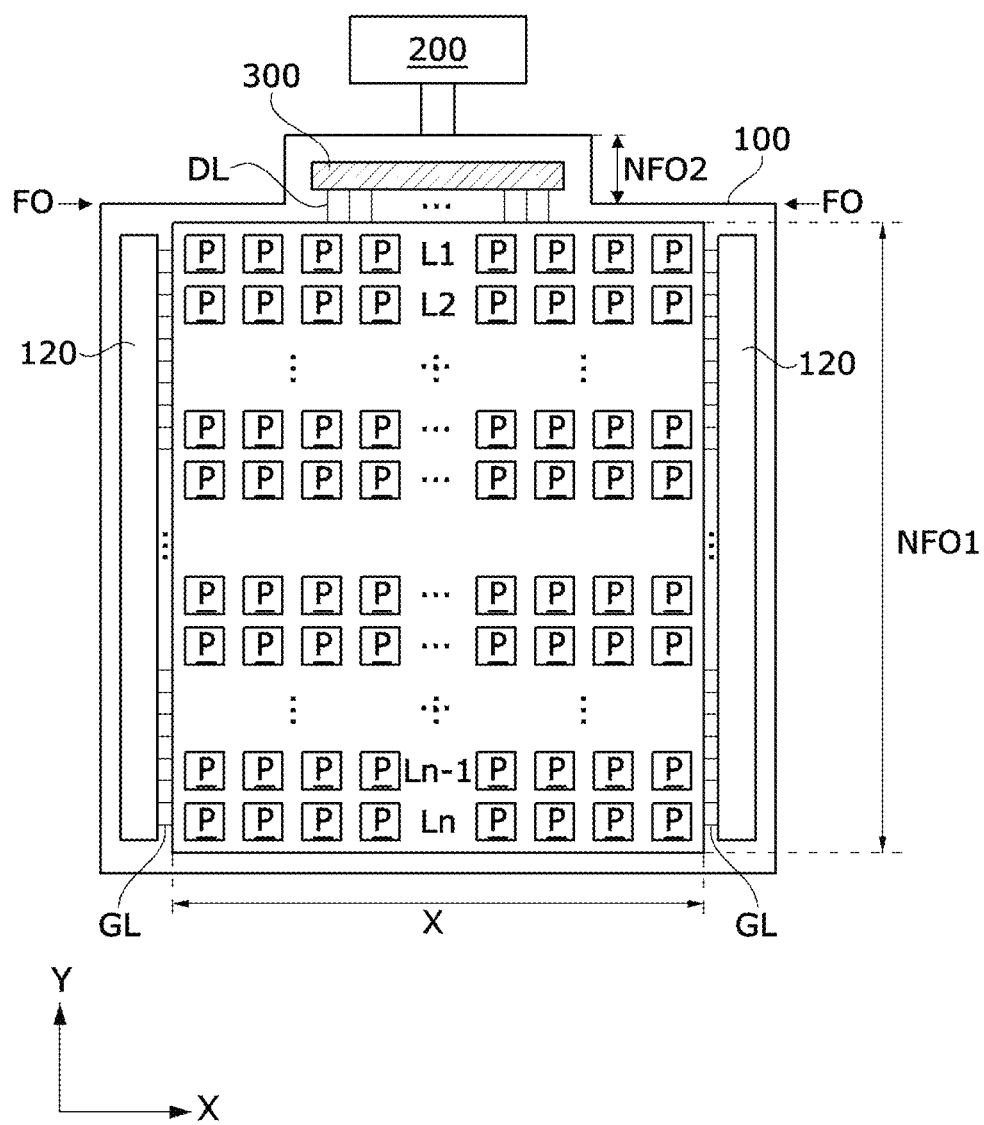
FIG. 22 is a block diagram illustrating an example of a display device according to one aspect of the present disclosure.
Figure 23:
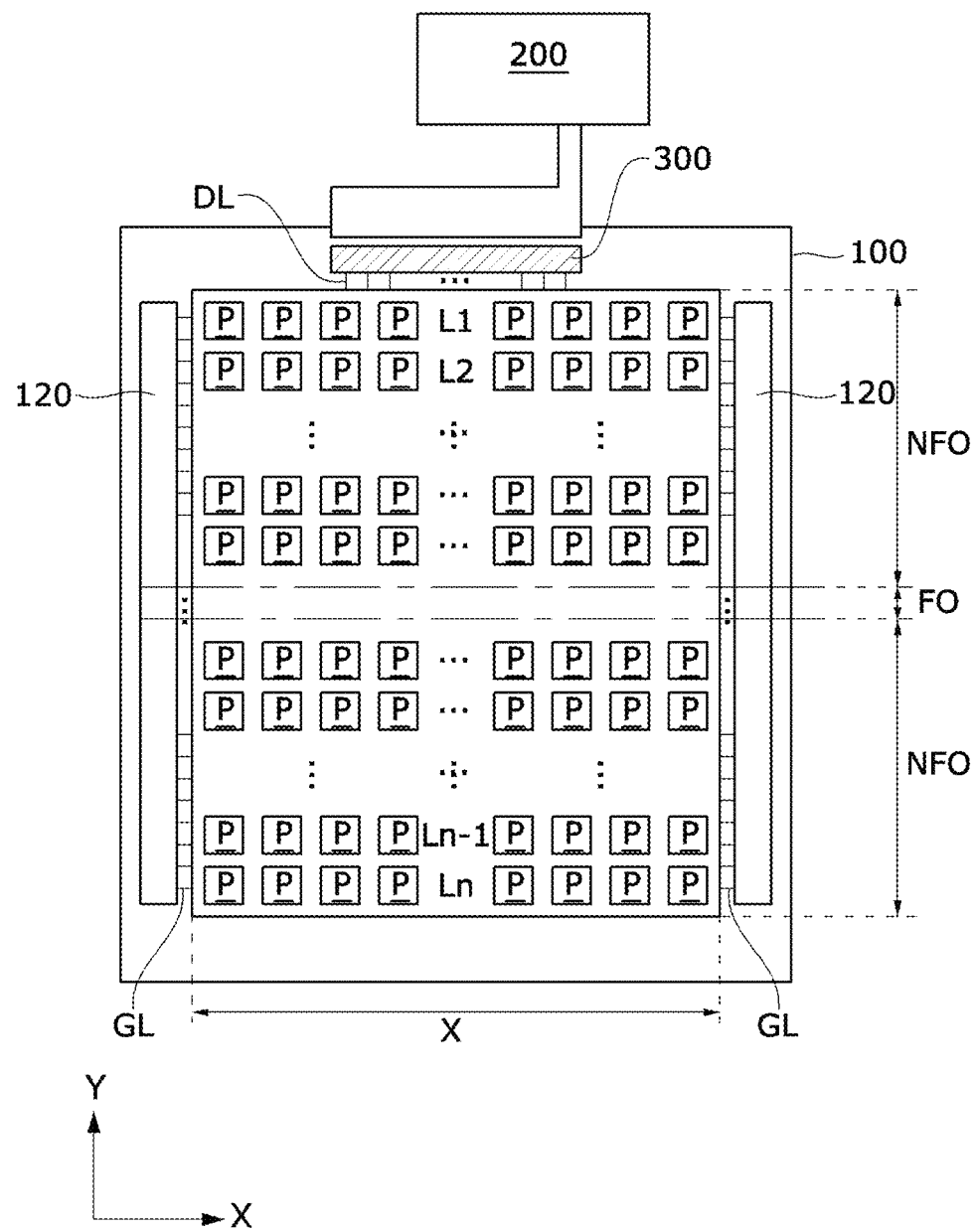
FIG. 23 is a block diagram illustrating an example of a display device according to another aspect of the present disclosure.
Figure 24A:
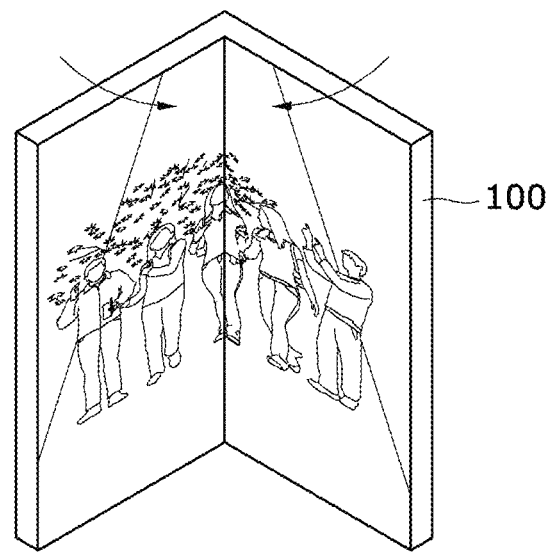
FIGS. 24A and 24B are diagrams illustrating examples in which the display device illustrated in FIG. 23 is folded.
Figure 24B:
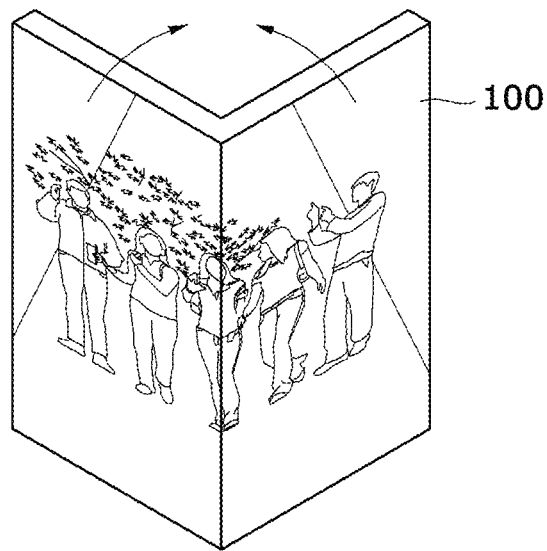
Figure 25:
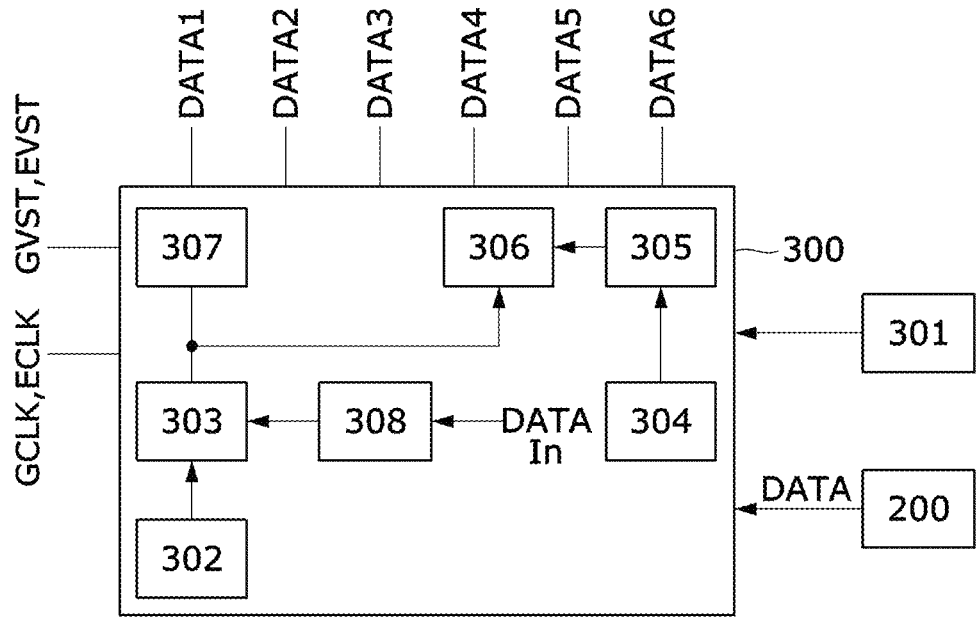
FIG. 25 is a schematic block diagram illustrating a configuration of a drive integrated circuit (IC)

FIG. 22 is a block diagram illustrating an example of a display device according to one aspect of the present disclosure. FIG. 23 is a block diagram illustrating an example of a display device according to another aspect of the present disclosure. FIGS. 24A and 24B are diagrams illustrating examples in which the display device illustrated in FIG. 23 is folded. FIG. 25 is a schematic block diagram illustrating a configuration of a drive integrated circuit (IC).

In the display device shown in FIG. 22, the display panel 100 may be folded based on a folding portion FO between first and second non-folding portions NFO1 and NFO2. The first non-folding portion NFO1 includes a pixel array of a screen on which an image is reproduced. The second non-folding portion NFO2 does not include a pixel array. A drive IC 300 may be mounted on the second non-folding portion NFO2, and the second non-folding portion NFO2 may be folded backward to the first non-folding portion NFO1.

In the display device shown in FIG. 23, the display panel 100 includes non-folding portions NFO which are folded based on the folding portion FO. In the display panel 100, the folding portion FO and the non-folding portions NFO may include a pixel array on which an input image is reproduced. In the display device shown in FIG. 23, when the flexible display panel 100 is unfolded, an entire screen of the display panel 100 may be activated to display an image on a maximum screen. When the display panel 100 is folded, a portion of the screen may be activated to display an image on an activated area that is smaller than the maximum screen, and a black color may be displayed or a previous image may be maintained on a deactivated area.

Referring to FIGS. 22 to 25, the display device includes the display panel 100 in which the pixel array is disposed on the screen, and the display panel driver.

The pixel array of the display panel 100 includes data lines DL, gate lines GL intersecting the data lines DL, and pixels P disposed in the form of a matrix defined by the data lines DL and the gate lines GL. As in the above-described aspects, a structure of the display panel 100 includes a circuit layer and a light-emitting element layer which are stacked on the glass substrate 10. The light-emitting element layer includes light-emitting elements of the pixel circuit.

The display panel 100 shown in FIG. 23 may be folded in an in-folding manner shown in FIG. 24A or an out-folding manner shown in FIG. 24B. In the in-folding manner, the screen on which the image is displayed is an inner surface which is folded in the display panel 100. Thus, when the display panel 100 is folded in the in-folding manner, the screen is not exposed to the outside. As shown in FIG. 24B, in the out-folding manner, the display panel 100 is an outer surface exposed to the outside when the display panel 100 is folded.

In order to implement colors, each of the pixels P includes sub-pixels having different colors. The sub-pixels include red sub-pixel (hereinafter referred to as an "R sub-pixel"), green sub-pixel (hereinafter referred to as a "G sub-pixel"), and blue sub-pixel (hereinafter referred to as a "B sub-pixel"). Although not shown in the drawings, each of the pixels P may further include a white sub-pixel. Hereinafter, the pixel may be construed as the sub-pixel unless otherwise defined. Each of the sub-pixels may include the pixel circuit.

The pixel circuit may include a light-emitting element, a driving element which supplies a current to the light-emitting element, a plurality of switching elements for programming conduction condition of the driving element and for switching a current path between the driving element and the light-emitting element, and a capacitor for maintaining a gate voltage of the driving element.

The display panel driver writes pixel data of an input image in the pixels P. The display panel driver includes a data driver 306 which supplies a data voltage of pixel data to the data lines DL, and a gate driver 120 which sequentially supplies a gate pulse to the gate lines GL. The data driver 306 may be integrated in a drive IC 300.

The drive IC 300 may be bonded onto the display panel 100. The drive IC 300 receives pixel data and a timing signal of an input image from a host system 200, supplies a data voltage of the pixel data to the pixels, and synchronizes the data driver 306 with the gate driver 120.

The drive IC 300 is connected to the data lines DL through data output channels to supply a voltage of a data signal to the data lines DL. The drive IC 300 may output a gate timing signal for controlling the gate driver 120 through gate timing signal output channels. The gate timing signal generated from the timing controller 303 may include a gate start pulse VST and a gate shift clock CLK. The gate start pulse VST and the gate shift clock CLK swing between a gate-on voltage VGL and a gate-off voltage VGH. The gate timing signals, for example, the gate start pulse VST and the gate shift clock CLK, output from a level shifter 307 are applied to the gate driver 120 to control a shift operation of the gate driver 120.

The gate driver 120 may include a shift register formed in the circuit layer 14 of the display panel 100 together with the pixel array. The shift register of the gate driver 120 sequentially supplies a gate signal to the gate lines GL under the control of the timing controller 303. The gate signal may include a scan pulse and an EM pulse of a light emission signal. The shift register may include a scan driver which outputs a scan pulse and an EM driver which outputs an EM pulse. In FIG. 25, GVST and GCLK refer to gate timing signals input to the scan driver. EVST and ECLK refer to gate timing signals input to the EM driver.

The drive IC 300 may be connected to the host system 200, a first memory 301, and the display panel 100. The drive IC 300 may include a data receiving and calculating part 308, the timing controller 303, the data driver 306, a gamma compensation voltage generator 305, a power supply 304, and a second memory 302.

The data receiving and calculating part 308 includes a receiver for receiving pixel data, which is input as a digital signal from the host system 200, and a data calculator for processing the pixel data input through the receiver to improve image quality. The data calculator may include a data restoration part for decoding and restoring compressed pixel data and an optical compensator for adding a predetermined optical compensation value to the pixel data. The optical compensation value may be set to a value for correcting brightness of the pixel data on the basis of brightness of the screen measured based on a camera image which is captured in a manufacturing process.

The timing controller 303 provides the data driver 306 with pixel data of an input image received from the host system 200. The timing controller 303 generates a gate timing signal for controlling the gate driver 120 and a source timing signal for controlling the data driver 306 to control operation timings of the gate driver 120 and the data driver 306.

The data driver 306 converts the pixel data (a digital signal) received from the timing controller 303 into a gamma compensation voltage through a digital-to-analog converter (DAC) to provide voltages of data signals (for example, DATA1 to DATA6 as shown in FIG. 25) (hereinafter referred to as "data voltages"). The data voltages output from the data driver 306 are supplied to the data lines DL of the pixel array through an output buffer (a source amplifier AMP) connected to data channels of the drive IC 300.

The gamma compensation voltage generator 305 divides a gamma reference voltage from the power supply 304 through a voltage divider circuit to generate gamma compensation voltages for each gradation. The gamma compensation voltage is an analog voltage in which a voltage is set for each gradation of the pixel data. The gamma compensation voltage output from the gamma compensation voltage generator 305 is provided to the data driver 306.

The power supply 304 generates power required for driving the pixel array of the display panel 100, the gate driver 120, and the drive IC 300 using a direct current (DC)-DC converter. The DC-DC converter may include a charge pump, a regulator, a buck converter, and a boost converter. The power supply 304 may adjust a DC input voltage from the host system 200 to generate DC power such as a gamma reference value, the gate-on voltage VGL, the gate-off voltage VGH, a pixel drive voltage ELVDD, a low potential power voltage ELVSS, and an initialization voltage Vini. The gamma reference voltage is supplied to the gamma compensation voltage generator 305. The gate-on voltage VGL and the gate-off voltage VGH are supplied to the level shifter 307 and the gate driver 120. Pixel power, such as the pixel driving voltage ELVDD, the low potential power voltage ELVSS, and the initialization voltage Vini, is commonly supplied to the pixels P. The initialization voltage Vini is set to a DC voltage that is lower than the pixel driving voltage ELVDD and a threshold voltage of the light-emitting element OLED to suppress the light-emitting element OLED from emitting light.

When power is supplied to the drive IC 300, the second memory 302 stores a compensation value, resistor setting data, and the like which are received from the first memory 301. The compensation value may be applied to various algorithms for improving image quality. The compensation value may include an optical compensation value. The resistor setting data defines operations of the data driver 306, the timing controller 303, and the gamma compensation voltage generator 305. The first memory 301 may include a flash memory. The second memory 302 may include a static random access memory (SRAM).

The host system 200 may be implemented as an application processor (AP). The host system 200 may transmit pixel data of an input image to the drive IC 300 through a mobile industry processor interface (MIPI). For example, the host system 200 may be connected to the drive IC 300 through a flexible printed circuit (FPC).

The host system 200 may detect a folding state and an unfolding state of the display panel 100 shown in FIG. 23 and detect a folding angle using a sensor.

In the display device of the present disclosure, each of the pixel circuit and the gate driver may include a plurality of transistors. The transistors may be implemented as oxide TFTs including oxide semiconductors, low temperature poly silicon (LTPS) TFTs including LTPSs, or the like. Each of the transistors may be implemented as a p-channel TFT or an n-channel TFT. In the aspect, the transistors of the pixel circuit are mainly described as an example implemented as p-channel TFTs, but the present disclosure is not limited thereto.

The transistor is a three-electrode element including a gate, a source, and a drain. The source is an electrode for supplying carriers to the transistor. In the transistor, the carriers begin to flow from the source. The drain is an electrode in which the carriers are discharged from the transistor to the outside. In the transistor, the carriers flow from the source to the drain. In the case of an n-channel transistor, since the carrier is an electron, a source voltage is lower than a drain voltage so as to allow electrons to flow from the source to the drain. In the n-channel transistor, a current flows in a direction from the drain to the source. In the case of a p-channel transistor (a p-type metal oxide semiconductor (PMOS)), since the carrier is a hole, the source voltage is higher than the drain voltage so as to allow holes to flow from the source to the drain. In the p-channel transistor, since the holes flow from the source to the drain, a current flows from the source to the drain. It should be noted that the source and the drain of the transistor are not fixed. For example, the source and the drain may be changed according to an applied voltage. Therefore, the present disclosure is not limited to the source and the drain of the transistor. In the following description, the source and the drain of the transistor will be referred to as a first electrode and a second electrode, respectively.

A gate pulse swings between a gate-on voltage and a gate-off voltage. The gate-on voltage is set to a voltage that is higher than a threshold voltage of the transistor, and the gate-off voltage is set to a voltage that is lower than the threshold voltage of the transistor. The transistor is turned on in response to the gate-on voltage, whereas the transistor is turned off in response to the gate-off voltage. In the case of the n-channel transistor, the gate-on voltage may be a gate high voltage VGH, and the gate-off voltage may be a gate low voltage VGL. In the case of the p-channel transistor, the gate-on voltage may be the gate low voltage VGL, and the gate-off voltage may be the gate high voltage VGH.

The driving element of each of the pixels may be implemented as a transistor. The driving element should have a uniform electrical characteristic in all the pixels. However, there may be a difference between the pixels due to a process deviation and an element characteristic deviation, and an electrical characteristic may be varied with the passage of driving time of a display. In order to compensate for an electrical characteristic deviation of the driving element, the display device may include an internal compensation circuit and an external compensation circuit. The internal compensation circuit is added to the pixel circuit in each of the sub-pixels to sample a threshold voltage Vth and/or mobility μ of the driving element, which are varied according to the electrical characteristic of the driving element, and compensate for a variation in real time. The external compensation circuit transmits the threshold voltage Vth and/or the mobility μ of the driving element, which are detected through sensing lines connected to the sub-pixels, to an external compensator. A compensator of the external compensation circuit compensates for a variation in electrical characteristic of the driving element by reflecting the detected result and modulating the pixel data of the input image. The external compensation circuit senses a voltage of the pixel, which is varied according to the electrical characteristic of the driving element, and modulates the data of the input image in an external circuit on the basis of the detected voltage, thereby compensating for the electrical characteristic deviation of the driving element between the pixels.

Figure 26:
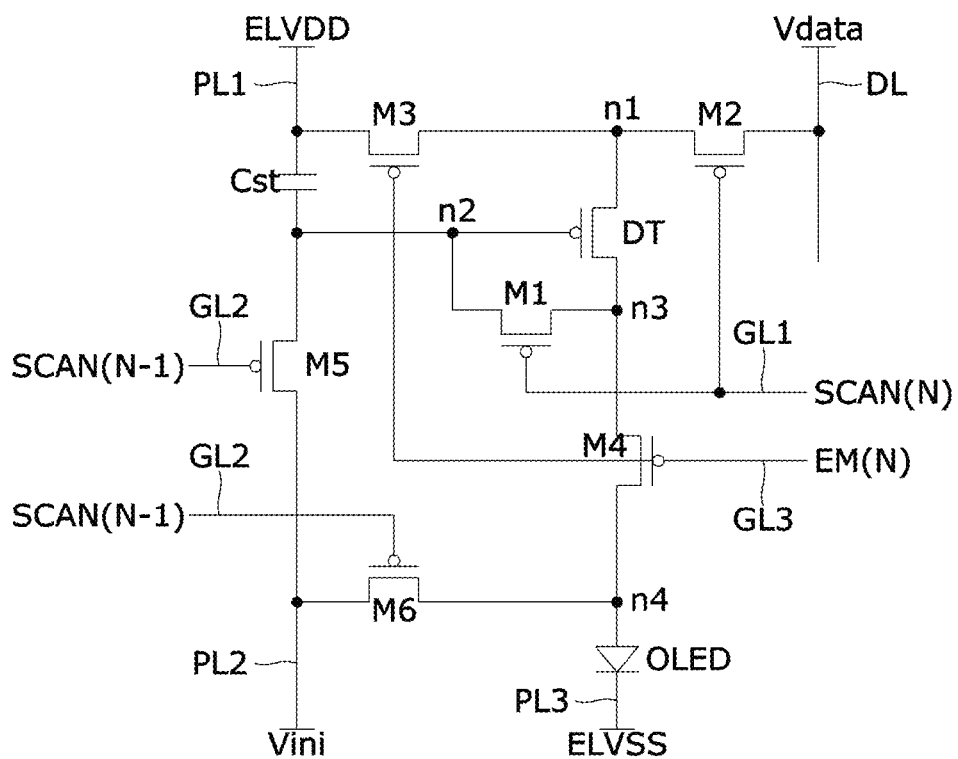
FIG. 26 is a circuit diagram illustrating an example of a pixel circuit.
Figure 27:
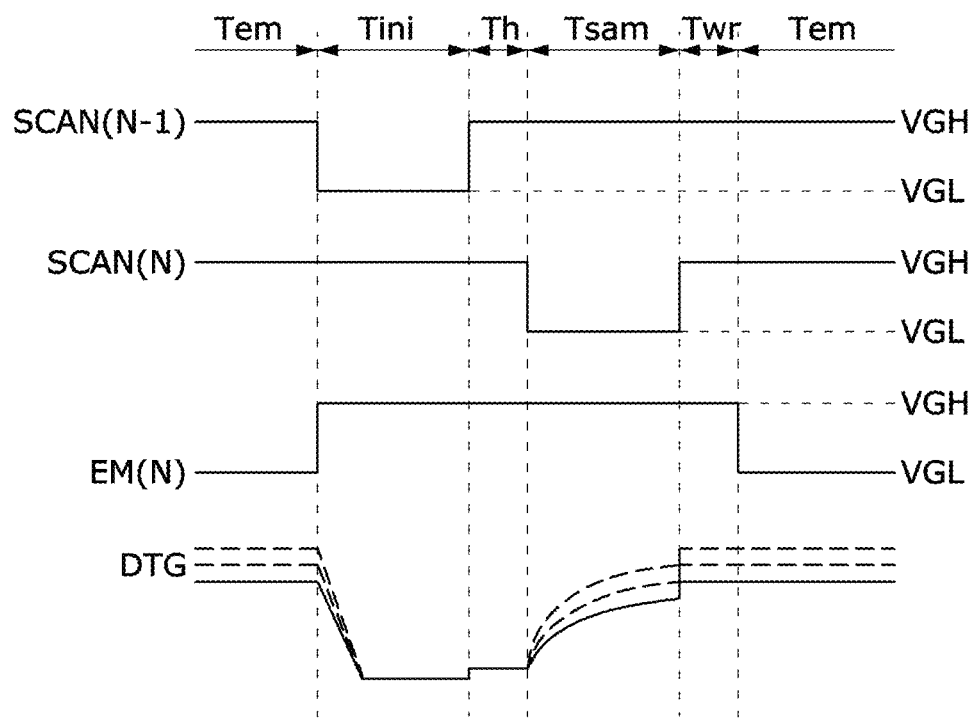
FIG. 27 is a diagram illustrating a driving method of the pixel circuit shown in FIG. 26.

FIG. 26 is a circuit diagram illustrating an example of the pixel circuit. FIG. 27 is a diagram illustrating a driving method of the pixel circuit shown in FIG. 26. A pixel circuit applicable to the present disclosure is not limited to the pixel circuit shown in FIGS. 26 and 27.

Referring to FIGS. 26 and 27, the pixel circuit includes a light-emitting element OLED, a driving element DT which supplies a current to the light-emitting element OLED, and an internal compensation circuit for sampling a threshold voltage Vth of the driving element DT using a plurality of switching elements M1 to M6 to compensate for a gate voltage of the driving element DT by a voltage as much as the threshold voltage Vth of the driving element DT. Each of the driving element DT and the switching elements M1 to M6 may be implemented as a p-channel TFT.

A driving period of the pixel circuit using the internal compensation circuit may be divided into an initialization period Tini, a sampling period Tsam, a data write period Twr, and a light emission period Tem.

During the initialization period Tini, a $(N-1)^{th}$ scan signal SCAN(N-1) is generated as a gate-on voltage VGL, and a voltage of each of an $N^{th}$ scan signal SCAN(N) and a light emission signal EM(N) is a gate-off voltage VGH. During the sampling period Tsam, the $N^{th}$ scan signal SCAN(N) is generated as a pulse of the gate-on voltage VGL, and a voltage of each of the $(N-1)^{th}$ scan signal SCAN(N-1) and the light emission signal EM(N) becomes the gate-off voltage VGH. During the data write period Twr, the voltage of each of the $(N-1)^{th}$ scan signal SCAN(N-1), the $N^{th}$ scan signal SCAN(N), and the light emission signal EM(N) becomes the gate-off voltage VGH. During at least a part of the light emission period Tem, the light emission signal EM(N) is generated as the gate-on voltage VGL, and the voltage of each of the $(N-1)^{th}$ scan signal SCAN(N-1) and the $N^{th}$ scan signal SCAN(N) is generated as the gate-off voltage VGH.

During the initialization period Tini, a fifth switching element M5 and a sixth switching element M6 are turned on according to the gate-on voltage VGL of the $(N-1)^{th}$ scan signal SCAN(N-1), thereby initializing the pixel circuit. During the sampling period Tsam, first and second switching elements M1 and M2 are turned on according to the gate-on voltage VGL of the $N^{th}$ scan signal SCAN(N), and a threshold voltage of the driving element DT is sampled to be charged in a capacitor Cst. During the data write period Twr, the first to sixth switching elements M1 to M6 are maintained in an OFF state. During the light emission period Tem, the third and fourth switch elements M3 and M4 are turned on so that the light-emitting element OLED emits light. During the light emission period Tem, in order to precisely express brightness of a low gradation at a duty ratio of the light emission signal EM(N), the light emission signal EM(N) may swing between the gate-on voltage VGL and the gate-off voltage VGH at a predetermined duty ratio to repeat an ON/OFF of the third and fourth switching elements M3 and M4.

The light-emitting element OLED may be implemented as an organic light-emitting diode or an inorganic light-emitting diode. Hereinafter, an example in which the light-emitting element OLED is implemented as an organic light-emitting diode will be described.

The light-emitting element OLED may include an organic compound layer formed between an anode and a cathode. The organic compound layer may include a hole injection layer HIL, a hole transport layer HTL, a light emission layer EML, an electron transport layer ETL, and an electron injection layer EIL, but the present disclosure is not limited thereto. When a voltage is applied to the anode and the cathode of the OLED, holes passing through the hole transport layer HTL and electrons passing through the electron transport layer ETL move to the light emission layer EML to form excitons so that visible light is emitted from the light emission layer EML.

The anode of the light-emitting element OLED is connected to a fourth node n4 between the fourth and sixth switching elements M4 and M6. The fourth node n4 is connected to the anode of the light-emitting element OLED, a second electrode of the fourth switching element M4, and a second electrode of the sixth switching element M6. The cathode of the light-emitting element OLED is connected to a VSS line PL3 to which a low potential power voltage ELVSS is applied. The light emitting element OLED emits light using a current Ids which flows according to a gate-source voltage Vgs of the driving element DT. A current path of the light-emitting element OLED is switched by the third and fourth switching elements M3 and M4.

The storage capacitor Cst is connected to a VDD line PL1 and a second node n2. A data voltage Vdata, which is compensated for by a voltage as much as the threshold voltage Vth of the driving element DT, is charged in the storage capacitor Cst. Since the data voltage Vdata in each sub-pixel is compensated for by a voltage as much as the threshold voltage Vth of the driving element DT, a characteristic deviation of the driving element DT in each sub-pixel is compensated for.

The first switching element M1 is turned on in response to the gate-on voltage VGL of the $N^{th}$ SCAN SCAN(N) to connect a second node n2 to a third node n3. The second node n2 is connected to a gate of the driving element DT, a first electrode of the storage capacitor Cst, and a first electrode of the first switching element M1. The third node n3 is connected to a second electrode of the driving element DT, a second electrode of the first switching element M1, and a first electrode of the fourth switching element M4. A gate of the first switching element M1 is connected to a first gate line GL1 to receive the $N^{th}$ scan pulse SCAN(N). The first electrode of the first switching element M1 is connected to the second node n2, and the second electrode thereof is connected to the third node n3.

The second switching element M2 is turned on in response to the gate-on voltage VGL of the $N^{th}$ scan pulse SCAN(N) to supply the data voltage Vdata to the first node n1. A gate of the second switching element M2 is connected to the first gate line GL1 to receive the $N^{th}$ scan pulse SCAN(N). The first electrode of the second switching element M2 is connected to the first node n1. The second electrode of the second switching element M2 is connected to the data line DL to which the data voltage Vdata is applied. The first node n1 is connected to the first electrode of the second switching element M2, a second electrode of the third switching element M3, and a first electrode of the driving element DT.

The third switching element M3 is turned on in response to the gate-on voltage VGL of the light emission signal EM(N) to connect the VDD line PL1 to the first node n1. A gate of the third switching element M3 is connected to the third gate line GL3 to receive the light emission signal EM(N). A first electrode of the third switching element M3 is connected to the VDD line PL1. The second electrode of the third switching element M3 is connected to the first node n1.

The fourth switching element M4 is turned on in response to the gate-on voltage VGL of the light emission signal EM(N) to connect the third node n3 to the anode of the light-emitting element OLED. A gate of the fourth switching element M4 is connected to the third gate line GL3 to receive the light emission signal EM(N). The first electrode of the fourth switching element M4 is connected to the third node n3, and the second electrode thereof is connected to the fourth node n4.

The fifth switching element M5 is turned on in response to the gate-on voltage VGL of the $(N-1)^{th}$ scan pulse SCAN(N-1) to connect the second node n2 to the Vini line PL2. A gate of the fifth switching element M5 is connected to the second gate line GL2 to receive the $(N-1)^{th}$ scan pulse SCAN(N-1). A first electrode of the fifth switching element M5 is connected to the second node n2, and a second electrode thereof is connected to the Vini line PL2.

The sixth switching element M6 is turned on in response to the gate-on voltage VGL of the $(N-1)^{th}$ scan pulse SCAN(N-1) to connect the Vini line PL2 to the fourth n4. A gate of the sixth switching element M6 is connected to the second gate line GL2 to receive the $(N-1)^{th}$ scan pulse SCAN(N-1). A first electrode of the sixth switching element M6 is connected to the Vini line PL2, and a second electrode thereof is connected to the fourth node n4.

The driving element DT controls a current Ids flowing in the light-emitting element OLED according to the gate-source voltage Vgs, thereby driving the light-emitting element OLED. The driving element DT includes the gate connected to the second node n2, the first electrode connected to the first node n1, and the second electrode connected to the third node n3.

During the initialization period Tini, the $(N-1)^{th}$ scan signal SCAN(N-1) is generated as the gate-on voltage VGL. During the initialization time Tini, the $N^{th}$ scan signal SCAN(N) and the light emission signal EM(N) are maintained at the gate-off voltage VGH. Thus, during the initialization period Tini, the fifth and sixth switching elements M5 and M6 are turned on so that the second and fourth nodes n2 and n4 are initialized at the initialization voltage Vini. A hold period Th may be set between the initialization period Tini and the sampling period Tsam. During the hold period Th, a voltage of SCAN(N−1), SCAN(N), and EM(N) are gate-off voltage VGH.

During the sampling period Tsam, the $N^{th}$ scan pulse SCAN(N) is generated as the gate-on voltage VGL. A pulse of the $N^{th}$ scan pulse SCAN(N) is synchronized with a data voltage Vdata of an $N^{th}$ pixel line. During the sampling period Tsam, each of the $(N-1)^{th}$ scan pulse SCAN (N−1) and the light emission signal EM(N) is maintained at the gate-off voltage VGH. Therefore, during the sampling period Tsam, the first and second switching elements M1 and M2 are turned on.

During the sampling period Tsam, a gate voltage DTG of the driving element DT rises due to a current flowing through the first and second switching elements M1 and M2. Since the driving element DT is turned off, the gate voltage DTG is a voltage of Vdata−|Vth|. In this case, a voltage of the third node n3 is also a voltage of Vdata−|Vth|. During the sampling period Tsam, the gate-source voltage Vgs of the driving element DT is a voltage of |Vgs|=Vdata−(Vdata−|Vth|)=|Vth|.

During the data write period Twr, the $N^{th}$ scan pulse SCAN(N) is reversed to the gate-off voltage VGH. During the data write period Twr, each of the $(N-1)^{th}$ scan pulse SCAN (N−1) and the light emission signal EM(N) is maintained at the gate-off voltage VGH. Therefore, during the data write period Twr, all the switching elements M1 to M6 are maintained in the OFF state.

During the light emission period Tem, the light emission signal EM(N) may be generated as the gate-off voltage VGH. During the light emission period Tem, in order to improve a low gradation expression, the light emission signal EM(N) may be turned on or off at a predetermined duty ratio to swing between the gate-on voltage VGL and the gate-off voltage VGH. Accordingly, the light emission signal EM(N) may be generated as the gate-on voltage VGL during at least a partial period of the light emission period Tem.

When the light emission signal EM(N) is the gate-on voltage VGL, a current flows between ELVDD and the light-emitting element OLED so that the light-emitting element OLED may emit light. During the light emission period Tem, the (N−1)th scan pulse SCAN(N−1) and the Nth scan pulse SCAN(N) are maintained at the gate-off voltage VGH. During the light emission period Tem, the third and fourth switching elements M3 and M4 are repeatedly turned on and off according to a voltage of the light emission signal EM(N). When the light emission signal EM(N) is the gate-on voltage VGL, the third and fourth switching elements M3 and M4 are turned on so that a current flows in the light-emitting element OLED. In this case, the gate-source voltage Vgs of the driving element DT becomes a voltage of |Vgs|=VDD−(Vdata−|Vth|), and the current flowing in the light-emitting element OLED is a current of $K(VDD-Vdata)^2$. K is a constant value determined by charge mobility, parasitic capacitance, and a channel capacity of the driving element DT.

Figure 28:
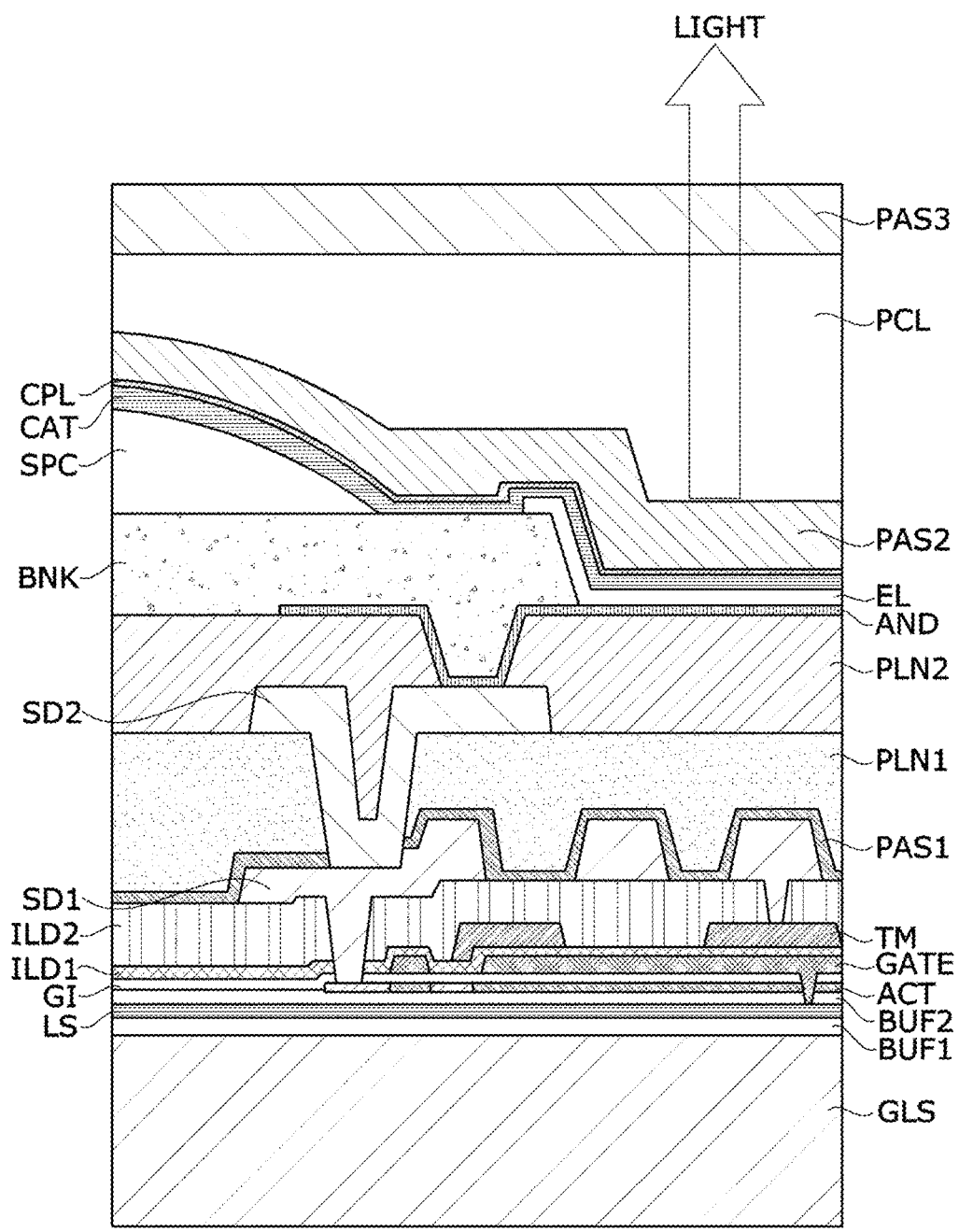
FIG. 28 is a detailed cross-sectional view illustrating a cross-sectional structure of a display panel according to one aspect of the present disclosure.

FIG. 28 is a detailed cross-sectional view illustrating a cross-sectional structure of the display panel 100 according to one aspect of the present disclosure. It should be noted that the cross-sectional structure of the display panel 100 shown in FIG. 28 is only an example, and the present disclosure is not limited thereto.

Referring to FIG. 28, as described above, a circuit layer, a light-emitting element layer, and an encapsulation layer may be stacked on a glass substrate GLS.

A first buffer layer BUF1 may be formed on the glass substrate GLS. A first metal layer LS may be formed on the first buffer layer BUF1, and a second buffer layer BUF2 may be formed on the first metal layer LS. Each of the first and second buffer layers BUF1 and BUF2 may be made of an inorganic insulating material and may be formed of one or more insulating layers. The first metal layer LS may include a metal pattern disposed below a TFT to block light emitted to a semiconductor channel layer of the TFT.

An active layer ACT may be formed on the second buffer layer BUF2. The active layer ACT includes semiconductor patterns of each of TFTs of the pixel circuit and a TFT of the gate driver. When the TFT is implemented as an oxide TFT, the semiconductor pattern may include indium gallium zinc oxide (IGZO).

A gate insulating layer GI may be formed on the active layer ACT. The gate insulating layer GI is an insulating layer made of an inorganic insulating material. A second metal layer GATE may be formed on the gate insulating layer GI. The second metal layer GATE may include a gate electrode of the TFT, and a gate line connected to the gate electrode.

A first interlayer insulating layer ILD1 may cover the second metal layer GATE. A third metal layer TM may be formed on the first interlayer insulating layer ILD1, and a second interlayer insulating layer ILD2 may cover the third metal layer TM. The capacitor Cst of the pixel circuit may be formed in a portion in which the second metal layer GATE, the first interlayer insulating layer ILD1, and the third metal layer TM overlap. The first and second interlayer insulating layers ILD1 and ILD2 may each include an inorganic insulating material.

A fourth metal layer SD1 may be formed on the second interlayer insulating layer ILD2, and an inorganic insulating layer PAS1 and a first planarization layer PLN1 may be stacked on the fourth metal layer SD1. A fifth metal layer SD2 may be formed on the first planarization layer PLN1. A part of a pattern of the fifth metal layer SD2 may be connected to the fourth metal layer SD1 through a contact hole passing through the first planarization layer PLN1 and the inorganic insulating layer PAS1. The first and second planarization layers PLN1 and PLN2 may each be made of an organic insulating material which planarizes a surface.

The fourth metal layer SD1 may include first and second electrodes of the TFT connected to the semiconductor pattern of the TFT through a contact hole passing through the second interlayer insulating layer ILD2. The data line DL and the power lines PL1 and PL2 may be implemented by patterning the fourth metal layer SD1 or the fifth metal layer SD2.

An anode electrode AND of the light-emitting element OLED may be formed on the second planarization layer PLN2. The anode electrode AND may be connected to an electrode of the TFT used as a switching element or a driving element through a contact hole passing through the second planarization layer PLN2. The anode electrode AND may be made of a transparent or translucent electrode material.

A pixel defining layer BNK may cover the anode electrode AND of the light-emitting element OLED. The pixel defining layer BNK is formed as a pattern defining a light-emitting area (or an opening area) through which light passes from each of the pixels to the outside. A spacer SPC may be formed on the pixel defining layer BNK. The pixel defining layer BNK and spacer SPC may be integrated using the same organic insulating material. The spacer SPC secures a gap between a fine metal mask (FMM) and the anode electrode AND so as to prevent the FMM from being in contact with the anode electrode AND in a deposition process of an organic compound EL.

The organic compound EL is formed in the light-emitting area of each of the pixels defined by the pixel defining layer BNK. A cathode electrode CAT of the light-emitting element OLED is formed on an entire surface of the display panel 100 to cover the pixel defining layer BNK, the spacer SPC, and the organic compound EL. The cathode electrode CAT may be connected to the VSS line PL3 which is formed of any one among the metal layers below the cathode electrode CAT. A capping layer CPL may cover the cathode electrode CAT. The capping layer CPL is formed of an inorganic insulating material, and the capping layer CPL blocks infiltration of air and out gassing of an organic insulating material applied on the capping layer CPL, thereby protecting the cathode electrode CAT. An inorganic insulating layer PAS2 may cover the capping layer CPL, and a planarization layer PCL may be formed on the inorganic insulating layer PAS2. The planarization layer PCL may include an organic insulating material. An inorganic insulating layer PAS3 of the encapsulation layer may be formed on the planarization layer PCL.

In accordance with the present disclosure, a flexible display panel is manufactured based on a glass substrate, and a residual glass film or a glass pattern is added in a folding portion of the flexible display panel so that rigidity of the folding portion can be increased.

In accordance with the present disclosure, there is no need for a process of separating a polyimide (PI) film substrate from a carrier substrate in a manufacturing process of the flexible display panel. Therefore, in accordance with the present disclosure, expensive laser equipment is not required, defects due to a process of delaminating the PI film substrate from the carrier substrate can be prevented, and rigidity in the folding portion of the flexible display panel can be increased to prevent folded creases or hinge stains.

In addition, in accordance with the present disclosure, rigidity of the folding portion can be further increased by adding beads of an organic material to the folding portion of the flexible display panel, and color reproducibility and a viewing angle of the folding portion can be improved using beads made of a quantum dot (QD) material.

Furthermore, in accordance with the present disclosure, since a circuit layer can be mounted on a glass substrate by removing the PI film substrate, it is possible not only to prevent wrinkles in the folding portion but also to enhance durability of the flexible display panel and reduce a manufacturing cost.

Effects which can be achieved by the present disclosure are not limited to the above-mentioned effects. That is, other features that are not mentioned may be obviously understood by those skilled in the art to which the present disclosure pertains from the following description.

It will be apparent to those skilled in the art that various modifications can be made to the above-described exemplary aspects of the present disclosure without departing from the spirit or scope of the disclosure. Thus, it is intended that the present disclosure covers all such modifications provided they fall within the scope of the appended claims and their equivalents.

It should be noted that the aspects of the present disclosure may be applied alone or combinations of aspects are possible.

A flexible display panel according to various aspects of the present disclosure may be described as follows.

Aspect 1: A flexible display panel includes a glass substrate 10; a circuit layer 14 disposed on the glass substrate 10 and configured to drive a pixel; a light-emitting element layer 16 disposed on the circuit layer 14; an encapsulation layer 18 which covers the circuit layer 14 and the light-emitting element layer 16; a polarizing plate 20 disposed on the encapsulation layer 18; and a cover glass disposed on the polarizing plate 20, as shown in FIGS. 5, 7, 11, 12, etc.

wherein at least one of the glass substrate and the cover glass includes a buffer portion.

The buffer portion includes an organic filler 30 and glass 40, and the glass 40 of the buffer portion has a thickness less than or equal to a thickness of the glass substrate and includes a pattern of a specific shape.

Aspect 2: The buffer portion further includes beads disposed in the organic filler as shown in FIG. 11.

Aspect 3: the buffer portion further includes a quantum dot (QD) material disposed in the organic filler as shown in FIG. 11.

Aspect 4: The cover glass further includes beads disposed in a folding area overlapping the buffer portion of the glass substrate as shown in FIG. 12.

Aspect 5: The beads include a quantum dot (QD) material.

Aspect 6: The flexible display panel of Aspect 1 further includes a bead film which is disposed between the polarizing plate and the cover glass and in which beads are dispersed as shown in FIG. 13.

Aspect 7: The beads are disposed in only a folding area overlapping the buffer portion of the glass substrate.

Aspect 8: the beads include a quantum dot (QD) material as shown in FIGS. 13 and 14.

Aspect 9: One or more buffer portions are disposed in a folding area which is bendable in the flexible display panel as shown in FIGS. 15A, 15B, 16A and 16B. In the folding area, a thickness of glass located in a portion having a large curvature is different from a thickness of glass located in a portion having a relatively small curvature.

Aspect 10: A ratio of a thickness of the organic filler to a thickness of the glass in the buffer portion is in a range of 6 to 10:4 to 9 as shown in FIGS. 5, 7, 11 and 12.

Aspect 11: The ratio of the thickness of the organic filler to the thickness of the glass in the buffer portion is 6:4.

Aspect 12: A sidewall of an edge of the glass substrate includes a wedge-shaped tapered surface which is vertically symmetrical and a thickness of the sidewall is decreased in a direction toward an end of the sidewall as shown in FIGS. 17 and 18.

Aspect 13: The tapered surface protrudes out of the circuit layer.

Aspect 14: A length of the tapered surface is inversely proportional to the thickness of the glass substrate.

Aspect 15: A flexible display panel includes a glass substrate 10; a circuit layer 14 disposed on the glass substrate 10 and configured to drive a pixel; a light-emitting element layer 16 disposed on the circuit layer 14; an encapsulation layer 18 which covers the circuit layer 14 and the light-emitting element layer 16; a polarizing plate 20 disposed on the encapsulation layer 18; and a cover glass 22 disposed on the polarizing plate 20.

At least one of the glass substrate and the cover glass includes a buffer portion. The buffer portion includes an organic filler and glass. A ratio of a thickness of the organic filler to a thickness of the glass in the buffer portion is in a range of 6 to 10:4 to 9.

Aspect 16: The light-emitting element layer includes an organic light-emitting diode (OLED). The circuit layer includes a transistor configured to supply a current to the organic light-emitting diode.

Aspect 17: The flexible display panel is foldable based on a folding area in which the buffer portion is located.

The features to be achieved by the present disclosure, the means for achieving the features, and effects of the present disclosure described above do not specify essential features of the claims, and thus, the scope of the claims is not limited to the disclosure of the present disclosure.

Although the aspects of the present disclosure have been described in more detail with reference to the accompanying drawings, the present disclosure is not limited thereto and may be embodied in many different forms without departing from the technical concept of the present disclosure. Therefore, the aspects disclosed in the present disclosure are provided for illustrative purposes only and are not intended to limit the technical concept of the present disclosure. The scope of the technical concept of the present disclosure is not limited thereto. Therefore, it should be understood that the above-described aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A flexible display panel comprising:
   a glass substrate;
   a circuit layer disposed on the glass substrate and configured to drive a pixel;
   a light-emitting element layer disposed on the circuit layer;
   an encapsulation layer disposed on the circuit layer and the light-emitting element layer;
   a polarizing plate disposed on the encapsulation layer; and
   a cover glass disposed on the polarizing plate,
   wherein the glass substrate includes a first buffer portion that includes an organic filler and glass,
   wherein the cover glass includes a second buffer portion,
   wherein a glass of the first buffer portion has a thickness less than or equal to a thickness of the glass substrate, and
   wherein beads are disposed in the second buffer portion.

2. The flexible display panel of claim 1, wherein the second buffer portion further includes an organic filler including the beads,
   wherein a glass of the second buffer portion has a thickness less than or equal to a thickness of the cover glass.

3. The flexible display panel of claim 1, wherein at least one of the first and second buffer portions further includes a quantum dot (QD) material.

4. The flexible display panel of claim 1, wherein the beads are disposed in a folding area overlapping with the glass substrate.

5. The flexible display panel of claim 1, wherein the beads include a quantum dot (QD) material.

6. A flexible display panel comprising
   a glass substrate;
   a circuit layer disposed on the glass substrate and configured to drive a pixel;
   a light-emitting element layer disposed on the circuit layer;
   an encapsulation layer disposed on the circuit layer and the light-emitting element layer;
   a polarizing plate disposed on the encapsulation layer;
   a cover glass disposed on the polarizing plate; and
   a bead film disposed between the polarizing plate and the cover glass and in which beads are dispersed,
   wherein at least one of the glass substrate and the cover glass includes a buffer portion that includes an organic filler and glass.

7. The flexible display panel of claim 6, wherein the beads are disposed in a folding area overlapping with the buffer portion of the glass substrate.

8. The flexible display panel of claim 7, wherein the beads film includes a quantum dot (QD) material.

9. A flexible display panel comprising:
   a glass substrate:
   a circuit layer disposed on the glass substrate and configured to drive a pixel;
   a light-emitting element layer disposed on the circuit layer;
   an encapsulation layer disposed on the circuit layer and the light-emitting element layer;
   a polarizing plate disposed on the encapsulation layer; and
   a cover glass disposed on the polarizing plate,
   wherein at least one of the glass substrate and the cover glass includes a buffer portion that includes an organic filler and glass,
   wherein the at least one of the glass substrate and the cover glass includes a first folding area having a first curvature being a maximum curvature and a second folding area immediately adjacent to the first folding area having a second curvature that is smaller than the first curvature, and
   wherein a glass located in the first folding area has a thickness different from that of the glass located in the second folding area.

10. The flexible display panel of claim 1, wherein a ratio of a thickness of the organic filler to a thickness of the glass in the buffer portion is in a range of 6 to 10:4 to 9.

11. The flexible display panel of claim 10, wherein the ratio of the thickness of the organic filler to the thickness of the glass in the buffer portion is 6:4.

12. The flexible display panel of claim 1, wherein a sidewall of an edge of the glass substrate includes a wedge-shaped tapered surface which is vertically symmetrical and a thickness of the sidewall is decreased in a direction toward an end of the sidewall.

13. The flexible display panel of claim 1, wherein a sidewall of an edge of the glass substrate includes a wedge-shaped tapered surface which is vertically symmetrical and a thickness of the sidewall is decreased in a direction toward an end of the sidewall,
   wherein the wedge-shaped tapered surface protrudes out of the circuit layer.

14. The flexible display panel of claim 1, wherein a sidewall of an edge of the glass substrate includes a wedge-shaped tapered surface which is vertically symmetrical and a thickness of the sidewall is decreased in a direction toward an end of the sidewall,
   wherein a length of the wedge-shaped tapered surface is inversely proportional to the thickness of the glass substrate.

15. A flexible display panel comprising:
   a glass substrate;
   a circuit layer disposed on the glass substrate and configured to drive a pixel;
   a light-emitting element layer disposed on the circuit layer;

an encapsulation layer disposed on the circuit layer and the light-emitting element layer;
a polarizing plate disposed on the encapsulation layer; and
a cover glass disposed on the polarizing plate,
wherein at least one of the glass substrate and the cover glass includes a buffer portion that includes an organic filler and glass, and
wherein the at least one of the glass substrate and the cover glass includes a first folding area having a first curvature being a maximum curvature and a second folding area immediately adjacent to the first folding area having a second curvature that is smaller than the first curvature, and
wherein the organic filler included in the first folding area has a thickness different from that of the organic filler included the second folding area.

16. The flexible display panel of claim 1, wherein the light-emitting element layer includes an organic light-emitting diode (OLED), and
wherein the circuit layer includes a transistor configured to supply current to the organic light-emitting diode.

17. The flexible display panel of claim 9, wherein the first folding area in which the buffer portion is located is bendable in the flexible display panel.

18. The flexible display panel of claim 15, wherein a sidewall of an edge of the glass substrate includes a wedge-shaped tapered surface which is vertically symmetrical and a thickness of the sidewall is decreased in a direction toward an end of the sidewall.

19. The flexible display panel of claim 18, wherein the wedge-shaped tapered surface protrudes out of the circuit layer.

20. The flexible display panel of claim 18, wherein a length of the wedge-shaped tapered surface is inversely proportional to the thickness of the glass substrate.

21. The flexible display panel of claim 6, wherein a sidewall of an edge of the glass substrate includes a wedge-shaped tapered surface which is vertically symmetrical and a thickness of the sidewall is decreased in a direction toward an end of the sidewall.

22. The flexible display panel of claim 9, wherein a sidewall of an edge of the glass substrate includes a wedge-shaped tapered surface which is vertically symmetrical and a thickness of the sidewall is decreased in a direction toward an end of the sidewall.

23. The flexible display panel of claim 6, wherein a sidewall of an edge of the glass substrate includes a wedge-shaped tapered surface which is vertically symmetrical and a thickness of the sidewall is decreased in a direction toward an end of the sidewall,
wherein the wedge-shaped tapered surface protrudes out of the circuit layer.

24. The flexible display panel of claim 9, wherein a sidewall of an edge of the glass substrate includes a wedge-shaped tapered surface which is vertically symmetrical and a thickness of the sidewall is decreased in a direction toward an end of the sidewall,
wherein the wedge-shaped tapered surface protrudes out of the circuit layer.

25. The flexible display panel of claim 6, wherein a sidewall of an edge of the glass substrate includes a wedge-shaped tapered surface which is vertically symmetrical and a thickness of the sidewall is decreased in a direction toward an end of the sidewall,
wherein a length of the wedge-shaped tapered surface is inversely proportional to the thickness of the glass substrate.

26. The flexible display panel of claim 9, wherein a sidewall of an edge of the glass substrate includes a wedge-shaped tapered surface which is vertically symmetrical and a thickness of the sidewall is decreased in a direction toward an end of the sidewall,
wherein a length of the wedge-shaped tapered surface is inversely proportional to the thickness of the glass substrate.

27. The flexible display panel of claim 15, wherein the first folding area in which the buffer portion is located is bendable in the flexible display panel.

* * * * *